US012731626B2

(12) United States Patent
Haratipour et al.

(10) Patent No.: US 12,731,626 B2
(45) Date of Patent: Sep. 8, 2026

(54) SELECTIVE FERROELECTRIC DEPLOYMENT FOR SINGLE-TRANSISTOR, MULTIPLE-CAPACITOR DEVICES

(71) Applicant: Intel Corporation, Santa Clara, CA (US)

(72) Inventors: Nazila Haratipour, Portland, OR (US); Christopher Neumann, Portland, OR (US); Brian Doyle, Portland, OR (US); Sou-Chi Chang, Portland, OR (US); Bernal Granados Alpizar, Beaverton, OR (US); Sarah Atanasov, Beaverton, OR (US); Matthew Metz, Portland, OR (US); Uygar Avci, Portland, OR (US); Jack Kavalieros, Portland, OR (US); Shriram Shivaraman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 129 days.

(21) Appl. No.: 17/957,591

(22) Filed: Sep. 30, 2022

(65) Prior Publication Data

US 2024/0112714 A1 Apr. 4, 2024

(51) Int. Cl.

| | |
|---|---|
| ***G11C 11/22*** | (2006.01) |
| ***H10B 53/30*** | (2023.01) |
| ***H10D 1/68*** | (2025.01) |

(52) U.S. Cl.

CPC ............ *G11C 11/221* (2013.01); *H10B 53/30* (2023.02); *H10D 1/682* (2025.01)

(58) Field of Classification Search

CPC ....... G11C 11/221; H10B 53/30; H10D 1/682

See application file for complete search history.

(56) References Cited

U.S. PATENT DOCUMENTS

| | | | | |
|---|---|---|---|---|
| 2019/0287599 | A1* | 9/2019 | Higashi | G11C 11/225 |
| 2023/0012093 | A1* | 1/2023 | Kakushima | G11C 11/2275 |
| 2024/0196624 | A1* | 6/2024 | Song | H10B 51/20 |

* cited by examiner

*Primary Examiner* — Fernando L Toledo
*Assistant Examiner* — Jorge Andres Lopez
(74) *Attorney, Agent, or Firm* — Essential Patents Group, LLP

(57) ABSTRACT

A memory device includes a group of ferroelectric capacitors with a shared plate that extends through the ferroelectric capacitors, has a greatest width between ferroelectric capacitors, and is coupled to an access transistor. The shared plate may be vertically between ferroelectric layers of the ferroelectric capacitors at the shared plate's greatest width. The memory device may include an integrated circuit die and be coupled to a power supply. Forming a group of ferroelectric capacitors includes forming an opening through an alternating stack of insulators and conductive plates, selectively forming ferroelectric material on the conductive plates rather than the insulators, and forming a shared plate in the opening over the ferroelectric material.

20 Claims, 14 Drawing Sheets

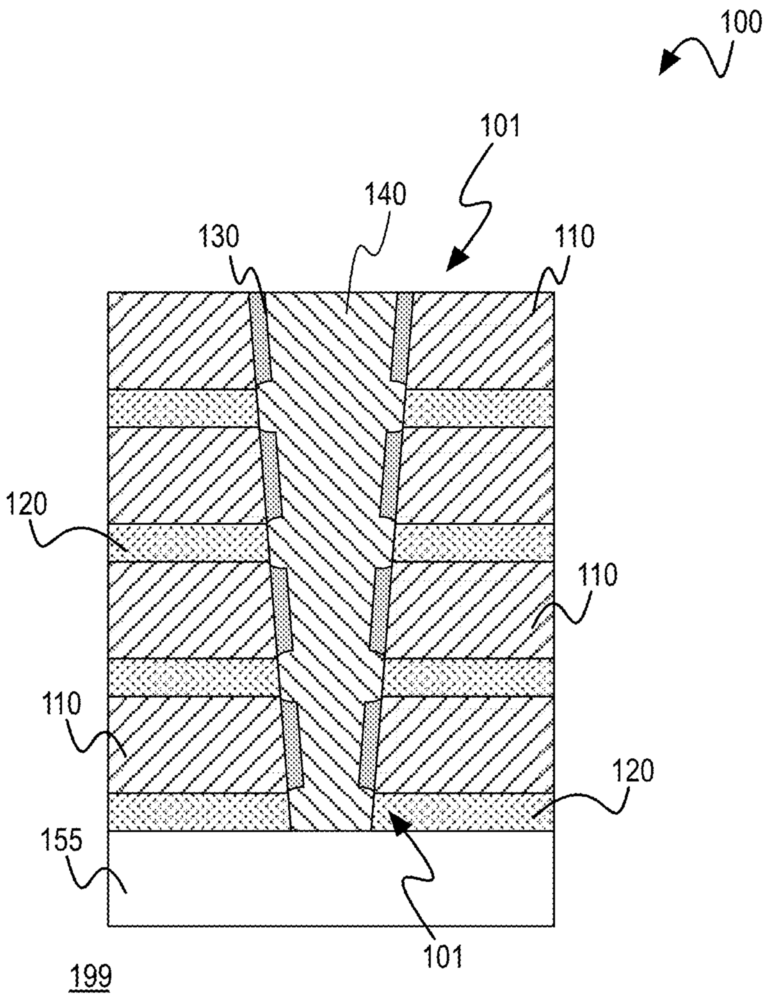
FIG. 4C
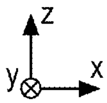

MEMORY 921
LOGIC 925
COMMUNICATION DEVICE 922
INTERCONNECTS, RDL LAYERS, MIM 926
PROCESSING DEVICE 901
REFRIGERATION DEVICE 923
HEAT REGULATION DEVICE 927
BATTERY/POWER REGULATION DEVICE 924
HARDWARE SECURITY DEVICE 928

COMPUTING DEVICE 900
PROCESSING DEVICE 901
COMMUNICATION CHIP 907
MEMORY 902
BATTERY/POWER 908
DISPLAY DEVICE 903
GPS DEVICE 909
AUDIO OUTPUT DEVICE 904
AUDIO INPUT DEVICE 910
OTHER OUTPUT DEVICE 905
OTHER INPUT DEVICE 911
HEAT REGULATOR/ REFRIGERATION DEVICE 906
SECURITY INTERFACE DEVICE 912
ANTENNA 913

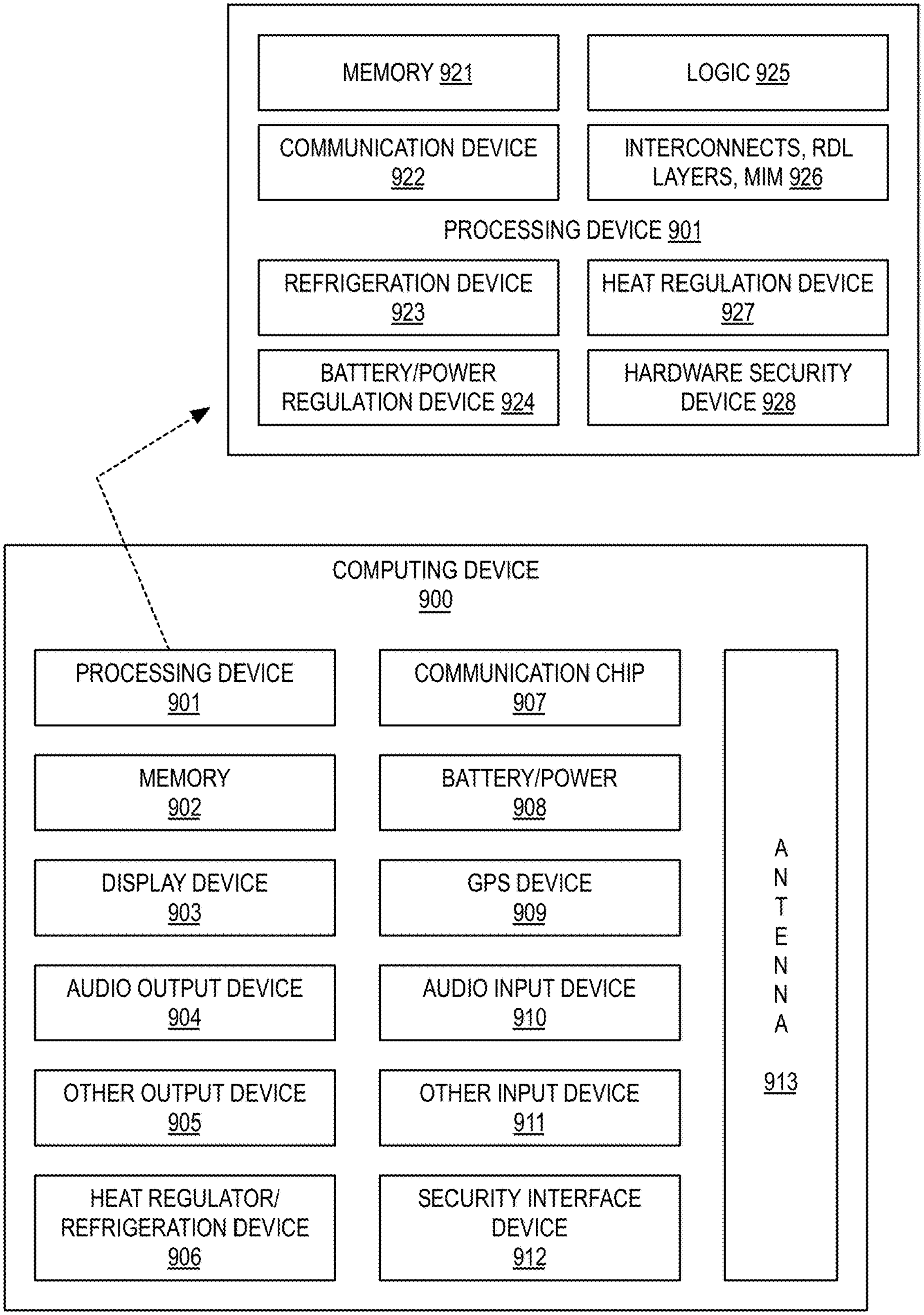

FIG. 9

SELECTIVE FERROELECTRIC DEPLOYMENT FOR SINGLE-TRANSISTOR, MULTIPLE-CAPACITOR DEVICES

BACKGROUND

Memory performance and cost pressures drive a continuous and ever-increasing demand for denser, cheaper, faster, more reliable, and less volatile memory devices. Improvements in the speed, density, and reliability of ferroelectric random-access memory (FeRAM) devices could readily improve and enable larger and more complex devices. For example, system performance can be improved by using denser FeRAM in place of other less-dense or more-volatile memory devices. More complex systems can be made better or less expensive with denser and cheaper FeRAM. Systems using existing FeRAM can be improved by using faster and more-reliable FeRAM.

Structures and methods are needed to improve FeRAM devices and the larger systems in which the FeRAM devices are deployed. It is with respect to these and other considerations that the present improvements have been needed. Such improvements may become critical as the desire to improve FeRAM become even more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements, e.g., with the same or similar functionality. The disclosure will be described with additional specificity and detail through use of the accompanying drawings:

FIGS. 4A, 4B, and 4C illustrate cross-sectional profile views of a memory device, including multiple ferroelectric capacitors with outer plates and ferroelectric layers around a shared inner plate, at various stages of manufacture;

FIG. 9 is a block diagram of an example computing device, all in accordance with some embodiments.

DETAILED DESCRIPTION

Figure 1:
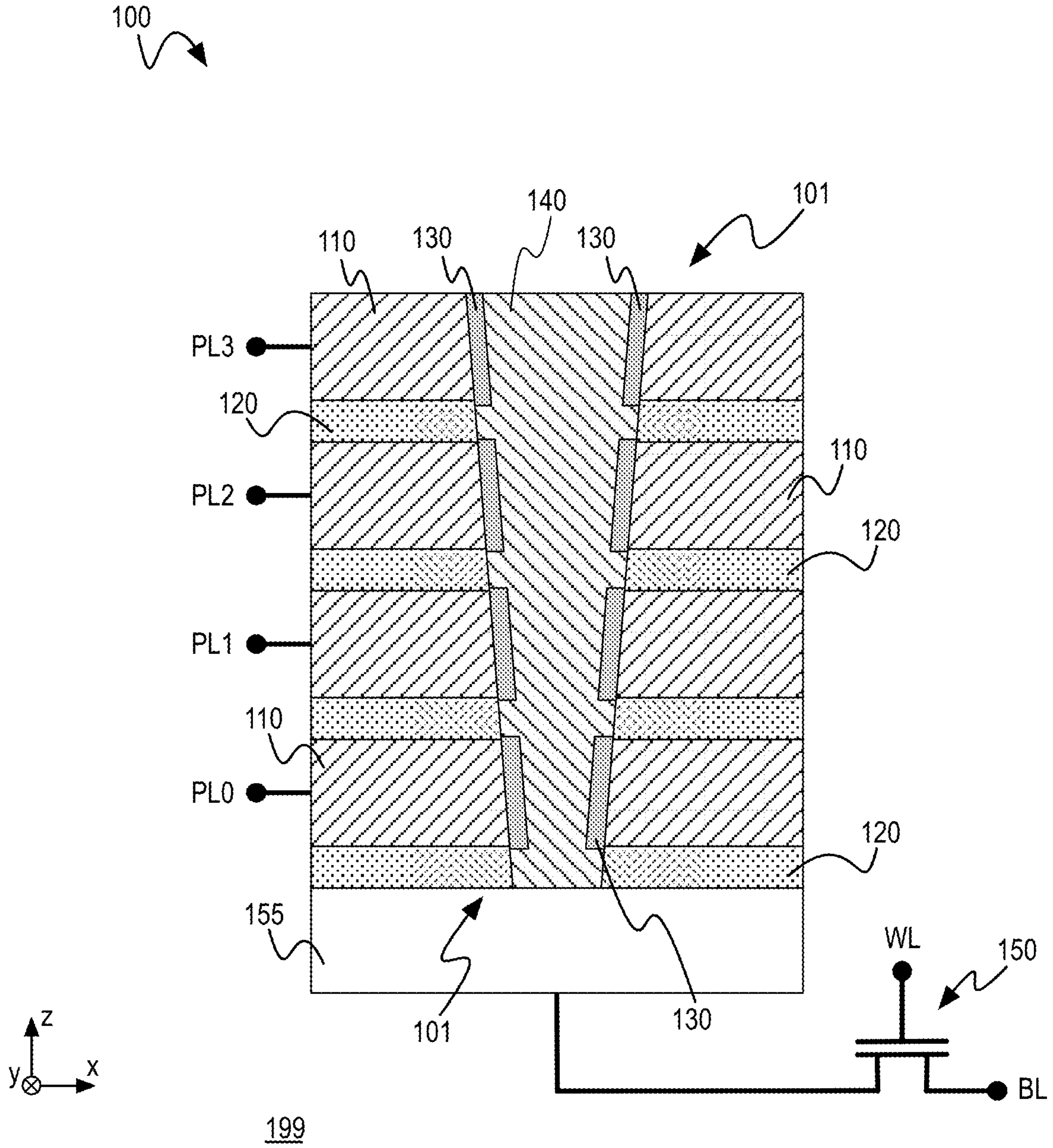
FIG. 1 illustrates a cross-sectional profile view of a memory device, including multiple ferroelectric capacitors with outer plates and ferroelectric layers around a shared inner plate.

In the following detailed description, reference is made to the accompanying drawings that show, by way of illustration, specific embodiments in which the claimed subject matter may be practiced. These embodiments are described in sufficient detail to enable those skilled in the art to practice the subject matter. The various embodiments, although different, are not necessarily mutually exclusive. For example, a particular feature, structure, or characteristic described herein, in connection with one embodiment, may be implemented within other embodiments without departing from the spirit and scope of the claimed subject matter.

References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled.

The terms "over," "to," "between," and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "coupled" and "connected," along with their derivatives, may be used herein to describe structural relationships between components. These terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and recitations of "top," "bottom," "above," and "below" refer to relative positions in the z-dimension with the usual meaning. However, embodiments are not necessarily limited to the orientations or configurations illustrated in the figure. The term "aligned" (i.e., vertically or laterally) indicates at least a portion of the components are aligned in the pertinent direction while "fully aligned" indicates an entirety of the components are aligned in the pertinent direction.

The terms "substantially," "close," "approximately," "near," and "about," generally refer to being within +/−10% of a target value (unless specifically specified). Unless otherwise specified in the specific context of use, the term "predominantly" means more than 50%, or more than half. For example, a composition that is predominantly a first constituent means more than half of the composition is the first constituent. The term "primarily" means the most, or greatest, part. For example, a composition that is primarily a first constituent means the composition has more of the first constituent than any other constituent. A composition that is primarily first and second constituents means the composition has more of the first and second constituents than any other constituent.

Unless otherwise specified, the use of the ordinal adjectives "first," "second," and "third," etc., to describe a common object, merely indicate that different instances of like objects to which are being referred and are not intended to imply that the objects so described must be in a given sequence, either temporally, spatially, in ranking, or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional," "profile," and "plan" correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Materials, structures, and techniques are disclosed to improve ferroelectric (FE) random-access memory (Fe-RAM) structures and the processes to manufacture them. Multiple bits of information can be stored in three-dimensional (3D) ferroelectric capacitors, e.g., groups of ferroelectric capacitors that are stacked vertically over a layer of transistors that control the ferroelectric capacitors. Multiple ferroelectric capacitors, each capable of storing a bit of data, may share a common plate formed in a hole for the group and be accessed by a single select transistor below the hole. Conventionally, adjacent ferroelectric capacitors in a group might share ferroelectric material deposited in a single, contiguous layer over, e.g., an entire wafer. While some extraneous ferroelectric material on horizontal surfaces would then be removed with an anisotropic etch, such a deposition and etch would leave ferroelectric material at least on a sidewall of the hole, e.g., between vertically adjacent outer plates. Ferroelectric material might then remain in at least trace amounts in undesired locations after the directional etch. Furthermore, the retained ferroelectric material may be damaged or unpredictably and undetectably modified by the dry anisotropic etch used for removal.

Rather than a contiguous layer of ferroelectric material shared amongst the ferroelectric capacitors in a group, these 3D ferroelectric capacitors can be formed each with its own, discrete ferroelectric layer. Such a selective deposition of ferroelectric material (on only desired metal surfaces) simplifies the process flow and improves memory reliability. Also, as ferroelectric materials may be high-k dielectric materials, selective deposition of ferroelectric material may significantly reduce parasitic capacitances, which increases speed. Eliminating even small amounts of extraneous ferroelectric material may beneficially decrease the parasitic capacitances that cause delays in signal propagation.

To minimize adverse effects of superfluous ferroelectric material in undesired areas, the ferroelectric material may be deployed only in desired locations. Such selective deployment may include selective removal from undesired locations. In some embodiments, ferroelectric material is deposited, e.g., conformally by atomic layer deposition (ALD), over a larger area, but ferroelectric material is selectively removed, e.g., by an atomic layer etch (ALE), from any surfaces besides the outer plates. Advantageously, rather than blanket deposit extraneous ferroelectric material, discrete ferroelectric layers can be deposited selectively, for example, only in desired locations or on desired materials. Deposition reactants can be chosen, along with growth-promoting and non-growth materials in the conductive plates and insulating layers, respectively, to promote deposition selectivity of ferroelectric material between the conductive plates and insulating layers. Non-growth materials are materials on which deposition of a ferroelectric material are inhibited or completely prevented. In some embodiments, ferroelectric material is selectively deposited over certain desired structures or materials, e.g., the conductive material of outer plates of 3D ferroelectric capacitor structures. In some embodiments, organic material, e.g., in self-assembling monolayers (SAMs), is used to limit deposition of ferroelectric material to outer plates, including platelines, of 3D ferroelectric capacitor structures. The organic material can be removed after ferroelectric material is deposited in the desired locations.

FIG. 1 illustrates a cross-sectional profile view of a memory device 100, including multiple ferroelectric capacitors 101 with outer plates 110 and ferroelectric layers 130 around a shared inner plate 140, in accordance with some embodiments. Some electrical connections and electrically connected components are represented schematically. Memory device 100 is in an integrated circuit (IC) die 199 and is coupled to a power supply through IC die 199. Memory device 100 includes an array of ferroelectric capacitors 101 stacked vertically. Ferroelectric capacitors 101 each include a separate outer plate 110 laterally around a separate ferroelectric layer 130. The array of ferroelectric capacitors 101 share inner plate 140, which extends vertically through ferroelectric capacitors 101, outer plates 110, and ferroelectric layers 130. Inner plate 140 couples, and electrically connects, to source contact 155 of select transistor 150. A group of insulators 120 are also around inner plate 140. Insulators 120 are vertically between and electrically isolate ferroelectric capacitors 101 at their outer plates 110.

Notably, vertically adjacent ferroelectric layers 130 are not contiguous to each other. A portion of inner plate 140 abuts insulator 120 where it is vertically between adjacent ferroelectric layers 130. This portion of inner plate 140, between vertically adjacent ferroelectric capacitors 101 (and between vertically adjacent ferroelectric layers 130), has a greater width than portions of inner plate 140 immediately above and below, within the respective ferroelectric capacitors 101 above and below. Inner plate 140 has a lesser width above and below where ferroelectric layers 130 are laterally internal to outer plates 110 within ferroelectric capacitors 101.

Ferroelectric capacitors 101, outer plates 110, ferroelectric layers 130, and inner plate 140 are coaxially aligned vertically. Although they share a center axis, ferroelectric capacitors 101 and its constituent components need not have circular cross-sections. Ferroelectric capacitors 101, outer plates 110, ferroelectric layers 130, and inner plate 140 may have, e.g., square or other rectangular concentric cross-sections in a horizontal plane. In some embodiments, these structures have yet other shapes. The coaxial geometry efficiently provides capacitor plate surface area for a given capacitor volume while allowing for simple manufacture of a vertical shared plate with outer plates easily accessible from any lateral direction, i.e., all 360° in a horizontal plane. The vertical orientation of the shared plate and the associated array of ferroelectric capacitors 101 conserves lateral area, but is not required. Coaxial plates are not required. Other orientations (e.g., horizontal) and geometries (e.g., parallel planar plates) can be used.

Outer plates 110 may be of any sufficiently electrically conductive material. In some embodiments, outer plates 110 include a metal, such as tungsten or molybdenum. In some embodiments, outer plates 110 include titanium and nitrogen (e.g., titanium nitride). Other materials may be used.

Outer plates 110 may each be part of an integrated structure with a corresponding plateline. For example, ferroelectric layer 130 may be on an inner surface of a corresponding plateline, which is integral with corresponding outer plate 110. In the example of FIG. 1, ferroelectric layers 130 are each on an inner surface of a corresponding one of platelines PL0, PL1, PL2, PL3, which are each integral with a corresponding outer plate 110.

Access or select transistor 150 controls access to the memory array by electrically connecting (or not) inner plate 140 to, e.g., a bitline BL connected at a drain contact on the electrically opposite end of select transistor 150. Although a source or drain terminal or contact may be specified in some instances, such usage is not limiting in the context of this description. Either terminal can be used in place of the other in the provided examples. When select transistor 150 conducts, inner plate 140 on source contact 155 is electrically connected to bitline BL on the drain contact. The conduction of select transistor 150 is controlled by the voltage signal applied to gate electrode, e.g., by a wordline WL. Since inner plate 140 is a shared plate for all ferroelectric capacitors 101 in the group, any bit stored in any of the group's ferroelectric capacitors 101 is accessible by the single select transistor 150.

With select transistor 150 accessing the entire memory array of ferroelectric capacitors 101 via inner plate 140, individual control of ferroelectric capacitors 101 is by controlling outer plates 110 using platelines PL0-PL3 in concert with select transistor 150 using wordline WL. With select transistor 150 conducting, an individual bit corresponding to one of ferroelectric capacitors 101 can be read (or written) by applying a voltage differential across that ferroelectric capacitor 101 (and only that ferroelectric capacitor 101) by applying the same voltage level on source contact 155 and all the platelines but for the plateline connected to the outer plate 110 corresponding to the ferroelectric capacitor 101 to be read (or written). In this way, a voltage can be applied across inner plate 140 and an individual outer plate 110 to charge (or write to) or discharge (or read from) only that ferroelectric capacitor 101. Control of storage ferroelectric capacitors 101 may vary with memory scheme used, e.g., control and signal routing.

In the examples shown in FIG. 1 and below, ferroelectric layer 130 may be a ferroelectric material with a high relative permittivity. Ferroelectric layer 130 may include a ferroelectric material with a higher relative permittivity than high-k dielectric materials that lack the spontaneous polarization of materials in a ferroelectric phase (orthorhombic or tetragonal, with non-centrosymmetric crystallinity). For example, a high-k dielectric comprising predominantly hafnium and oxygen ($HfO_x$), but not in a ferroelectric phase, may have a relative permittivity in the range of 10-14. However, hafnium oxide in a ferroelectric phase may have a relative permittivity exceeding 25 (e.g., 30). Although in both instances the $HfO_x$ comprises predominantly hafnium and oxygen, ferroelectric layer 130 advantageously includes a ferroelectric phase of a material, e.g., hafnium oxide. In the case of hafnium oxide (and other pertinent metal oxides, as described below), such phases may be achieved, for example, through the addition of a dopant, such as niobium, titanium, silicon, germanium, aluminum, yttrium, lanthanum, etc.

Many ferroelectric materials are suitable for use in ferroelectric layer 130. As used herein, the term ferroelectric material indicates a material that has a spontaneous electric polarization that may be controlled by the application of an external electric field. Ferroelectric materials exhibit a hysteresis such that when a positive voltage is applied, a positive residual charge is maintained even as the voltage falls to zero. This residual charge is characterized as polarization. To remove the polarization, a negative voltage must be applied. Furthermore, the negative voltage may be used to provide a negative polarization, which is also maintained as the voltage again goes to zero. In ferroelectric capacitors 101 and other capacitor structures discussed herein, a differential voltage must be applied across a ferroelectric capacitor to polarize ferroelectric layer 130 (i.e., the ferroelectric material) either positively or negatively. This positive or negative polarity may then be read as 1 or 0. Besides the advantage of higher relative permittivity, ferroelectric materials and this polarization have this non-volatility advantage over non-ferroelectric dielectric materials.

Advantageously, ferroelectric layer 130 includes a ferroelectric material that may be deposited conformally and to very narrow thicknesses, such as a two-dimensional (2D) material. Such is the case with numerous oxides of hafnium or similar metals, which may have advantages over, e.g., perovskite materials, such as lead zirconium titanate (PZT). In some embodiments, ferroelectric layer 130 includes hafnium, zirconium, and oxygen (HZO) (e.g., hafnium zirconium oxide, $Hf_{1-x}Zr_xO_2$). In some such embodiments, ferroelectric layer 130 includes dopants, e.g., lanthanum, silicon, yttrium, aluminum, etc., as previously described. In some embodiments, ferroelectric layer 130 includes hafnium, titanium, and oxygen (e.g., hafnium titanium oxide, $Hf_{1-x}Ti_xO_2$). In some embodiments, ferroelectric layer 130 includes hafnium, scandium, and oxygen. In some embodiments, ferroelectric layer 130 includes zirconium and oxygen (e.g., zirconium dioxide, $ZrO_2$) In some embodiments, ferroelectric layer 130 includes niobium and oxygen. Although, e.g., doped $HfO_x$, $ZrO_x$, or HZO are exemplary embodiments that can be advantageously conformally deposited by atomic layer deposition (ALD), ferroelectric layer 130 may also have other compositions similarly amenable to being deposited at temperatures compatible with, e.g., back-end-of-line (BEOL) structures and with similar thickness conformality. Other ferroelectric materials may be employed.

Ferroelectric layer 130 may have a thickness of 20 nm or less. In some embodiments, ferroelectric layer 130 has a thickness of 10 nm. The use of 2D materials may allow yet thinner ferroelectric layers 130. In some embodiments, ferroelectric layer 130 has a thickness of 4 nm.

Figure 2:
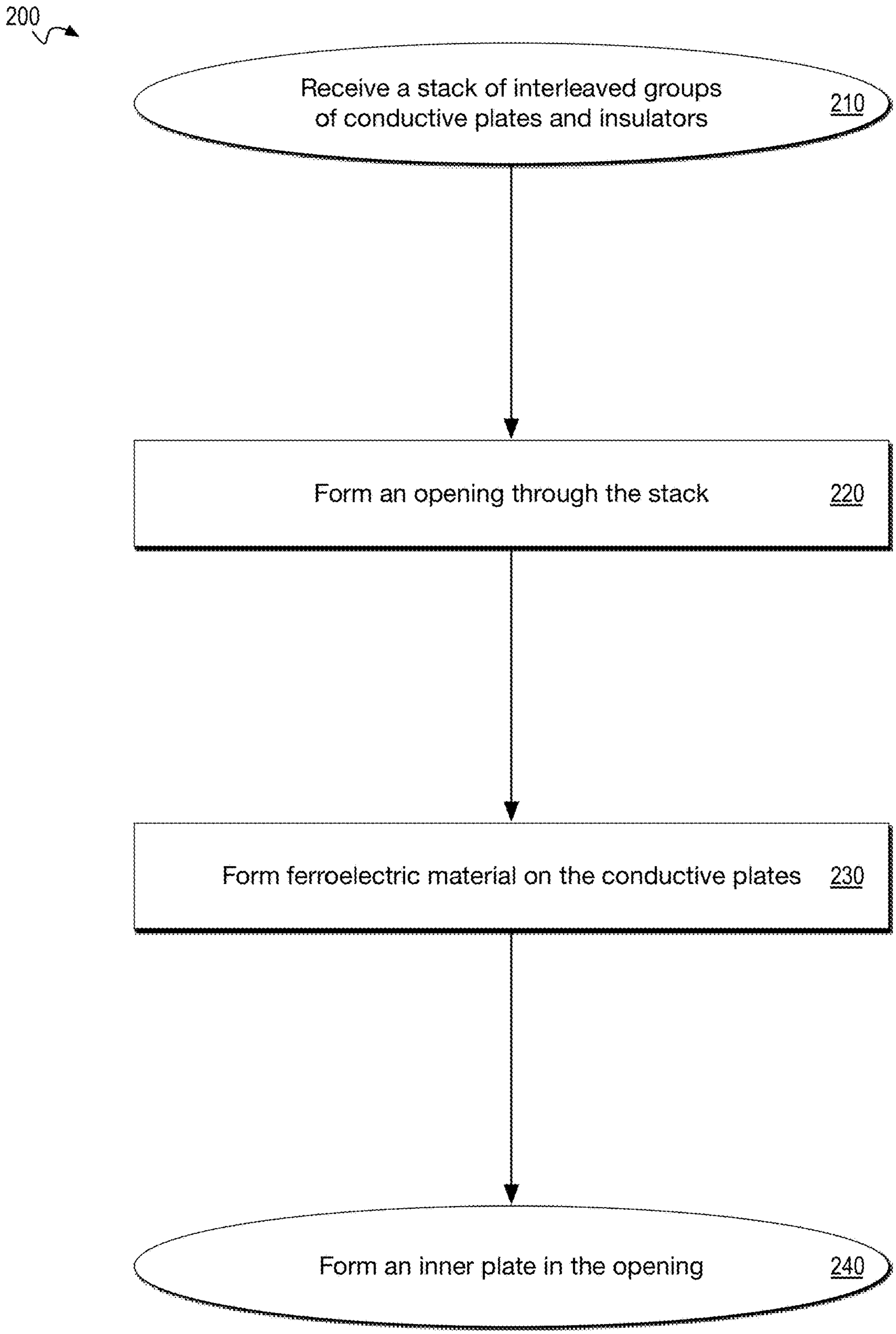
FIG. 2 illustrates various processes or methods for forming a three-dimensional ferroelectric capacitor array with selectively deployed ferroelectric material.

FIG. 2 illustrates various processes or methods 200 for forming a 3D ferroelectric capacitor array with selectively deployed ferroelectric material, in accordance with some embodiments. FIG. 2 shows methods 200 that includes operations 210-240. Some operations shown in FIG. 2 are optional. FIG. 2 shows an example sequence, but the operations can be done in other sequences as well, and some operations may be omitted. Some operations can also be performed multiple times before other operations are performed. Methods 200 generally entail forming ferroelectric capacitor arrays by forming a hole through alternating layers of conductors and insulators, by forming ferroelectric material over the layers of conductors, and by forming a shared, inner plate on the insulators and ferroelectric material such that the ferroelectric material is coupled to, and between, the shared, inner plate and the outer conductors.

In operation 210, an interleaved stack of electrically conductive plates and insulators is received. In some embodiments, the stack is of alternating conductors and insulators is on a front side of an IC die. In other embodiments, the stack is on a back side of an IC die. In some embodiments, the conductive plates are meant to be vertically aligned platelines. In some embodiments, each conductive plate covers a wide area and are meant to be divided laterally into multiple platelines. In some embodiments, a plateline may include, or otherwise be coupled to, multiple ferroelectric caps. Advantageously, the stack is over a transistor that will control access to an array of ferroelectric capacitors. In some embodiments, the stack of electrically conductive plates and insulators span multiple transistors, and the stack is used to form multiple ferroelectric capacitor arrays.

The electrically conductive plates may be of any suitable material, such as a metal, e.g., tungsten or molybdenum. In some embodiments, the conductive plates include titanium and nitrogen (e.g., titanium nitride). Other materials may be used. Advantageously, the conductive plates are of a material that is readily dry etched.

The insulators may be of any suitable material, such as known low-k dielectric materials. In some embodiments, the insulators include silicon and oxygen (e.g., silicon dioxide). In some embodiments, the insulators include the same or a similar oxide doped with carbon. In some embodiments, the materials for the conductive plates and the insulators are chosen to provide a deposition or etch selectivity between ferroelectric materials deposited on the conductive plates and insulators, as is described below.

In operation 220, an opening is formed in the alternating conductors and insulators. The opening may be formed by any suitable means. In some embodiments, the vertical hole is dry etched, e.g., with a reactive ion etch (RIE), such as a deep RIE (DRIE). In some embodiments, the opening is formed iteratively, e.g., sequentially through one material layer with one etch and through another material layer with another etch. In some embodiments, the opening has a continuous sidewall, shared by coplanar surfaces of the conductors and insulators. In some embodiments, the opening is formed down to a conductor coupled to an access transistor electrode, e.g., a source contact. In other embodiments, the opening in the layer stack is above a source contact of an access transistor, but the opening is formed down to retain a single, non-growth, insulating layer over the source contact. In some such embodiments, this non-growth, insulating layer at the bottom of the opening is the same insulating material in the interleaved stack, and in other embodiments, the non-growth, insulating layer is a different insulating material.

In operation 230, ferroelectric material is selectively formed over the conductive plates rather than over the insulators. Such a selective forming is a depositing of a ferroelectric material on the conductive plates, but with ferroelectric material not deposited on the insulators in the same quantity and/or quality. In some embodiments, ferroelectric material is deposited on the conductive plates, but is substantially absent from the insulators. In some embodiments, ferroelectric material is readily deposited on the conductive plates, but ferroelectric material is deposited on the insulators at a substantially lesser rate. In some embodiments, ferroelectric material is formed over both the conductive plates and insulators, but the ferroelectric material over the insulators is of a quality such that there is an etch selectivity between the ferroelectric material formed on the insulators and the ferroelectric material deposited on the conductive plates. In some embodiments, ferroelectric material is formed by chemical vapor deposition (CVD). In some such embodiments, ferroelectric material is formed by a cyclic deposition process, e.g., an ALD. Such a deposition process can be used to form ferroelectric layers in well-controlled manner.

Selective deposition of ferroelectric material on the conductive plates, but not on the insulators, may be by inherent selectivity between the conductive and insulating materials for a given precursor gas. Using, e.g., CVD, inherent selectivity can be exploited and enhanced by using a precursor gas and a complementary, growth-promoting conductive material such that the reactant gas readily nucleates on the conductive material. A non-growth material may be used in the insulating layers to inhibit or prevent the deposition of the ferroelectric material over the insulators by delaying nucleation, or causing poor nucleation, of a reactant gas on the insulating material. For example, precursors reactive with water may be used with a hydrophilic conductive material and a hydrophobic insulating material. In such embodiments, nucleation of the precursor gas on the hydrophobic insulating material will not readily occur, and ferroelectric material will not be deposited on the insulating material in the quantity or quality as ferroelectric material will be deposited on the hydrophilic conductive material. In some embodiments, ferroelectric material is selectively formed on the conductive plates using a precursor gas including hafnium, hydrogen, carbon, and nitrogen (e.g., $C_{12}H_{32}HfN_4$ or Tetrakis(ethylmethylamino)hafnium(IV) (TEMAH)). In some such embodiments, the conductive plates may be of a hydrophilic material, and the insulators may be of a non-growth material, e.g., a hydrophobic material (or even a material less hydrophilic than that of the conductive plates).

Selectively forming ferroelectric material on the conductive plates rather than over the insulators may include selectively removing ferroelectric material from over the insulators. For example, in some embodiments, ferroelectric material is removed from over the insulators, and not removed from the conductive plates. In some embodiments, ferroelectric material is removed from over the insulators and from the conductive plates, but ferroelectric material is removed from over the insulators at a higher rate, e.g., a greater etch rate, than from the conductive plates. In some embodiments, a cyclic etch process, e.g., an ALE, is used to selectively remove ferroelectric material from over the insulators. An ALE may be used as a well-controlled etch to selectively remove individual layers of ferroelectric material from over the insulators. In some such embodiments, ferroelectric material is removed by an ALE using an etchant gas including boron and chlorine (e.g., $BCl_3$). In some embodiments, ferroelectric material is removed by an ALE using an etchant gas including hydrogen and fluorine (e.g., HF).

Depositing and etching, as examples, may be performed together, including iteratively, to form ferroelectric material on the conductive plates but substantially absent from the insulators. Ferroelectric material may be selectively formed and selectively removed, and then selectively formed and selectively removed again, e.g., to increase a thickness of a ferroelectric layer or to increase the coverage area of a ferroelectric layer. In some embodiments, an ALD and an ALE are used iteratively to selectively form and selectively remove ferroelectric material. As cyclic processes, ALD and ALE processes may pair well in that the deposition and etch cycles can be conveniently iteratively interleaved, for example, within a same processing chamber.

In some embodiments, ferroelectric material is formed, e.g., by a cyclic deposition process, on the conductive plates and over the insulators, but the ferroelectric layer over the insulators is of a lesser quantity and/or of a lesser quality such that the ferroelectric layer over the insulators is later removed, e.g., by a cyclic etch process, and the ferroelectric layer on the conductive plates is retained. In some embodiments, ferroelectric material is deposited on the conductive plates at a higher deposition rate than the ferroelectric material is formed over the insulators, and the ferroelectric material is etched back to remove the ferroelectric material over the insulators but retain the ferroelectric material on the conductive plates. In some embodiments where a ferroelectric layer of a lesser quality is formed over the insulators, the lesser quality ferroelectric material may allow for the ferroelectric material over the insulators to selectively removed, e.g., by an etch with an etch selectivity between the ferroelectric material over the insulators and the ferroelectric material on the conductive plates. In some such embodiments, the ferroelectric material over the insulators is selectively removed, and the ferroelectric material on the conductive plates is not substantially removed. In other such embodiments, the ferroelectric material over the insulators is removed at a faster rate than the ferroelectric material on the conductive plates until the ferroelectric material over the insulators is removed but the ferroelectric material on the conductive plates is retained.

A non-growth, mask material may be used over the insulators to limit deposition of ferroelectric material selectively to the conductive plates. In some embodiments, organic material is adsorbed or otherwise deposited onto the insulators and formed into molecular assemblies (for example, SAMs) before ferroelectric material is deposited. The organic material may prevent ferroelectric material from being deposited on the insulators. Any suitable material may be used, including one or more organic polymers. In some embodiments, an organic material is deposited in monolayers, e.g., SAMs, but the monolayers need not be self-assembled. In some embodiments, the organic material includes a silane. In some embodiments, the organic material includes silicon, hydrogen, and at least one of carbon or chlorine. Ferroelectric material may be deposited on the conductive plates and not substantially on the insulators before the organic material is removed, e.g., by an isotropic etch. In some embodiments, the etch is selective to the organic material. In some embodiments, a dry etch is used.

A non-growth, mask material may also be used below the lowest of the conductive plates. In some embodiments, a non-growth mask is formed at the bottom of the opening, e.g., over an electrically conductive structure, such as a select transistor source electrode. A non-growth material may inhibit or prevent the deposition of ferroelectric material by delaying, or causing poor, nucleation of a reactant on, e.g., a select transistor source contact. In some embodiments, the non-growth material is in a carbon hard mask. In some such embodiments, the non-growth material includes silicon and carbon. In some embodiments, the non-growth material includes amorphous carbon. In some such embodiments, the non-growth material includes silicon and nitrogen. In some embodiments, the non-growth material is an organic material. In some such embodiments, the non-growth, organic material is also used in masks over the insulators. The mask material may later be selectively removed, e.g., by a wet etch or a dry anisotropic etch, such as a RIE.

A conductive structure at the bottom of the opening, e.g., an access transistor source contact, may be exposed when ferroelectric material is deposited. Such a conductive structure may be of a non-growth material, e.g., a metal that does not readily nucleate with the precursors chosen. In some embodiments, ferroelectric material is not substantially deposited on an exposed conductive structure at the bottom of the opening. In some embodiments, ferroelectric material of a lesser quality is deposited on an exposed conductive structure at the bottom of the opening (relative to ferroelectric material deposited on the conductive plates).

Further material removal may be performed, e.g., of materials described above, prior to forming a common, second plate to pair with the received conductive plates. In some embodiments, a non-growth, mask material, e.g., over the insulators or at the bottom of the opening, is removed. In some embodiments, a non-growth material at the bottom of the opening, e.g., a bottom layer in the interleaved stack, is removed, e.g., below but laterally within the existing sidewalls of the opening. In some embodiments, lesser-quality ferroelectric material deposited not on the conductive plates is removed. Such material removals may be by any suitable means, e.g., by a wet etch or a dry etch.

In operation 240, a group of ferroelectric capacitors is formed by forming a common plate in the opening, shared by the ferroelectric capacitors. The common plate is of a conductive material formed on the insulators and the ferroelectric material, and is shared by the group of conductive plates in which the opening was formed. The forming of the common plate completes the group of ferroelectric capacitors by forming for each ferroelectric capacitor a second, inner plate separated from each individual, outer plate by a discrete layer of ferroelectric material.

Any suitable means or materials may be used to form the inner plate. Known processes used for forming metallization structures in substantially vertical holes, such as via structures, may be suitable. In some embodiments, a damascene process is used. In some embodiments, the inner plate includes copper or tungsten. In some embodiments, the common, inner plate is formed on, e.g., a metallization structure, such as a select transistor source contact, after removing an insulating, non-growth material, e.g., a mask material formed at the bottom of the opening.

Figure 3A:
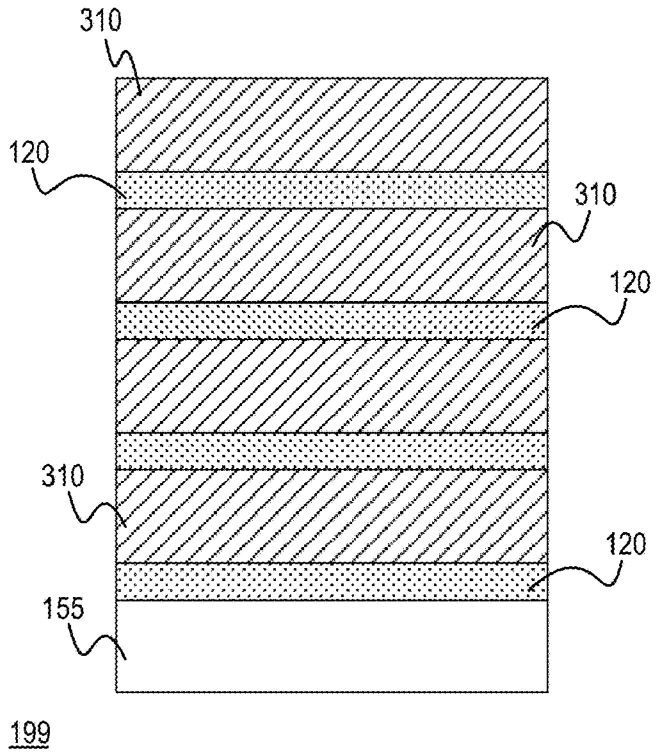
FIGS. 3A, 3B, 3C, 3D, and 3E illustrate cross-sectional profile views of a memory device, including multiple ferroelectric capacitors with outer plates and ferroelectric layers around a shared inner plate, at various stages of manufacture.

FIGS. 3A, 3B, 3C, 3D, and 3E illustrate cross-sectional profile views of memory device 100, including multiple ferroelectric capacitors 101 with outer plates 110 and ferroelectric layers 130 around shared inner plate 140, at various stages of manufacture, in accordance with some embodiments. FIG. 3A shows an interleaved stack of conductive plates 310 and insulators 120 over source contact 155 of an access transistor (not shown) in IC die 199. The same or similar stack may be received, e.g., in operation 210 of methods 200 as shown in FIG. 2, and used for forming a 3D ferroelectric capacitor array with selectively deployed ferroelectric material.

Figure 3B:
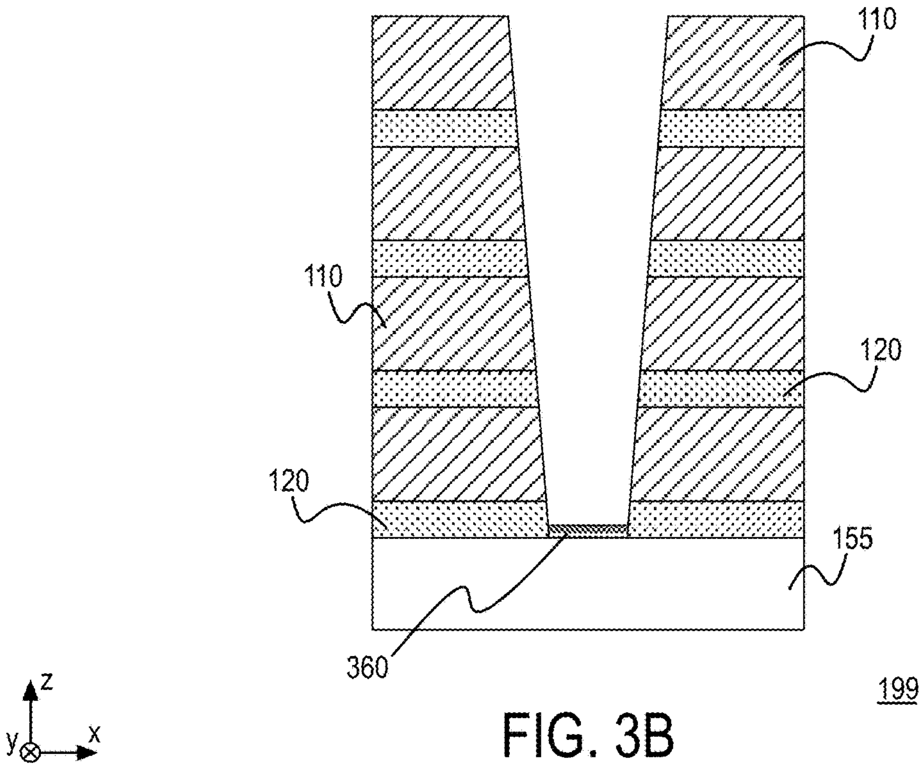

FIG. 3B shows outer plates 110 and insulators 120 around an opening, e.g., as formed in operation 220 of methods 200, over source contact 155. In the example of FIG. 3B, a mask of a non-growth material 360 is at the bottom of the opening over source contact 155. Such a mask may be deposited by methods 200 as described.

Figure 3C:
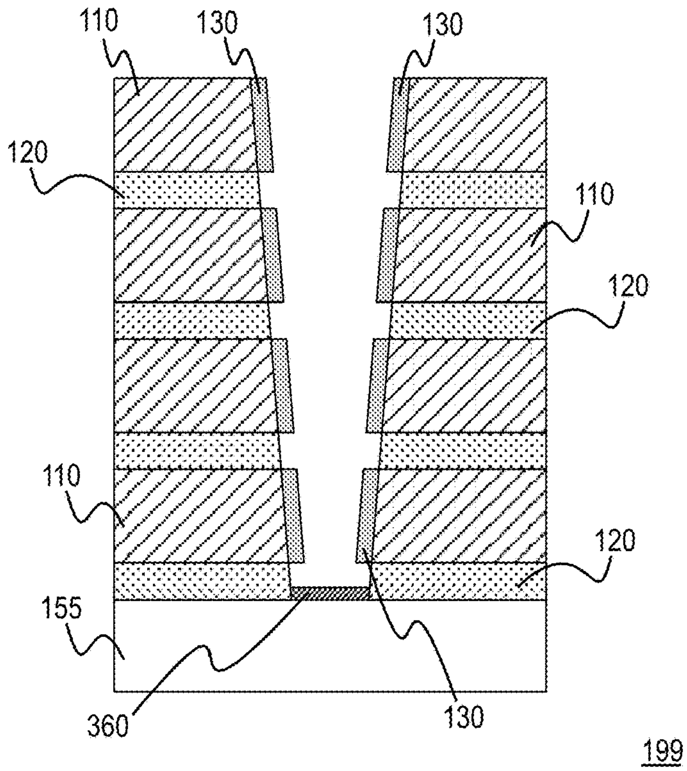

FIG. 3C shows ferroelectric layers 130 on outer plates 110 but not on insulators 120, e.g., as selectively formed by operation 230 of methods 200. No ferroelectric material is deposited on non-growth material 360.

Figure 3D:
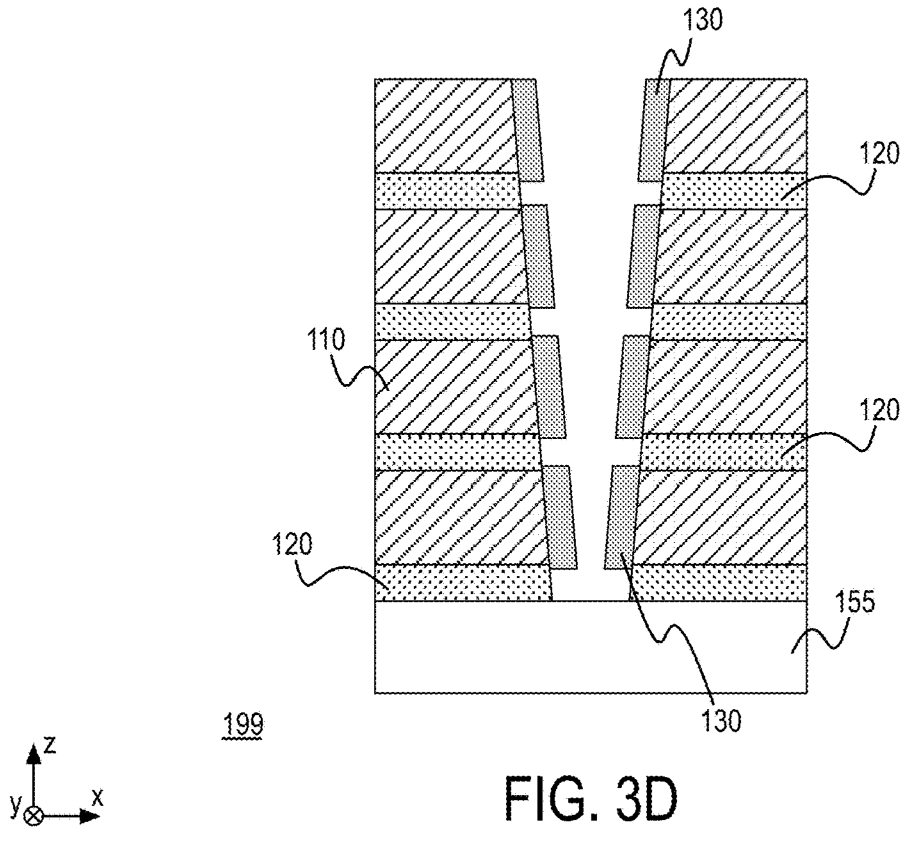

FIG. 3D shows thicker ferroelectric layers 130 covering more area, including outer plates 110. The larger ferroelectric layers 130 might be selectively formed by one or more additional iterations of operation 230 of methods 200.

No non-growth material 360 is over source contact 155, which is exposed, e.g., for coupling to an inner plate common to outer plates 110.

Figure 3E:
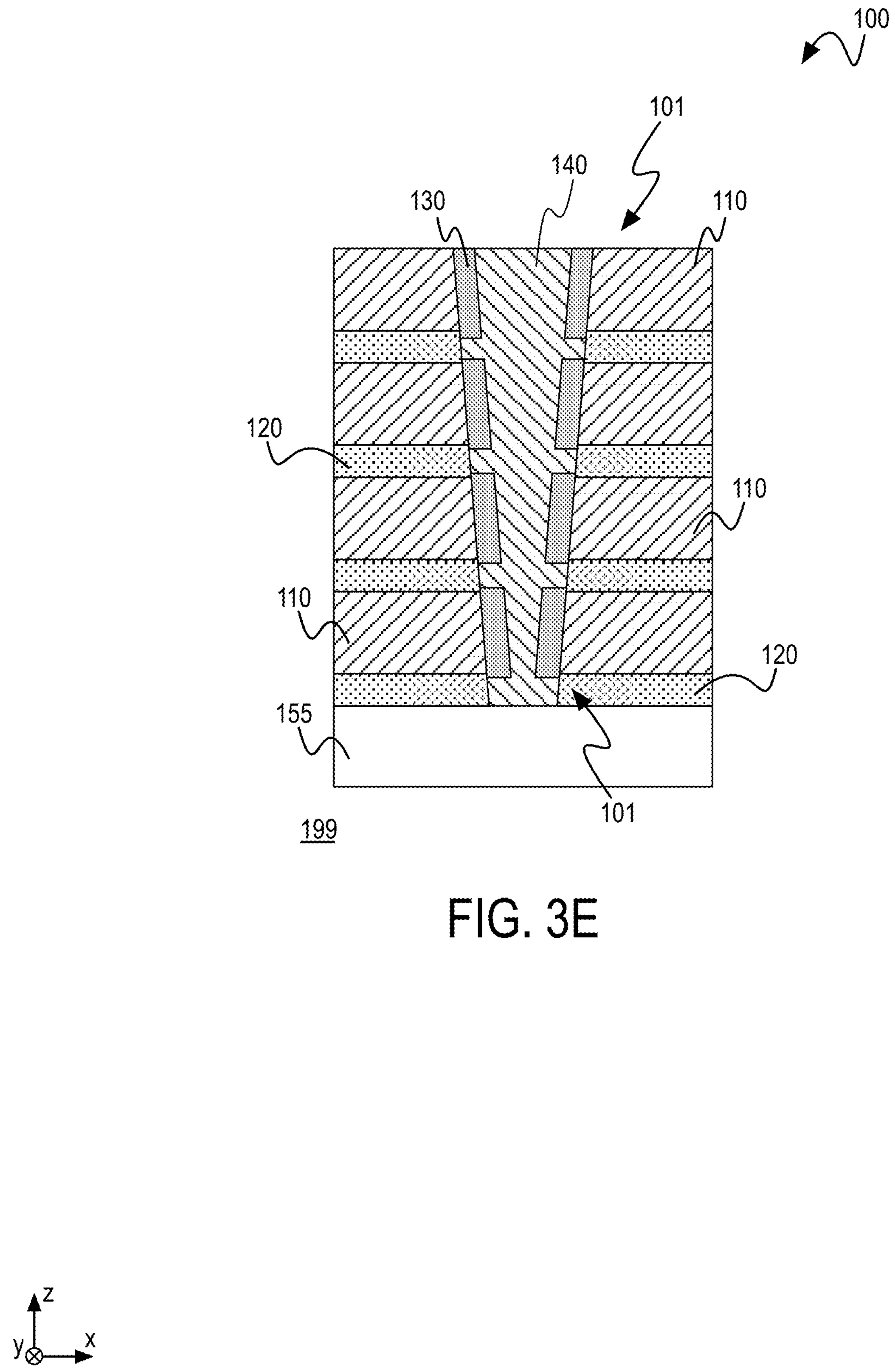

FIG. 3E shows shared inner plate 140, e.g., as may be formed by operation 240 of methods 200, in memory device 100 in IC die 199. Inner plate 140 is common to multiple ferroelectric capacitors 101 with outer plates 110 and ferroelectric layers 130 around inner plate 140. Outer plates 110 of ferroelectric capacitors 101 are separated by insulators 120. Inner plate 140 is coupled to source contact 155 and electrically connected to the associated access transistor through its source contact 155.

Figure 4A:
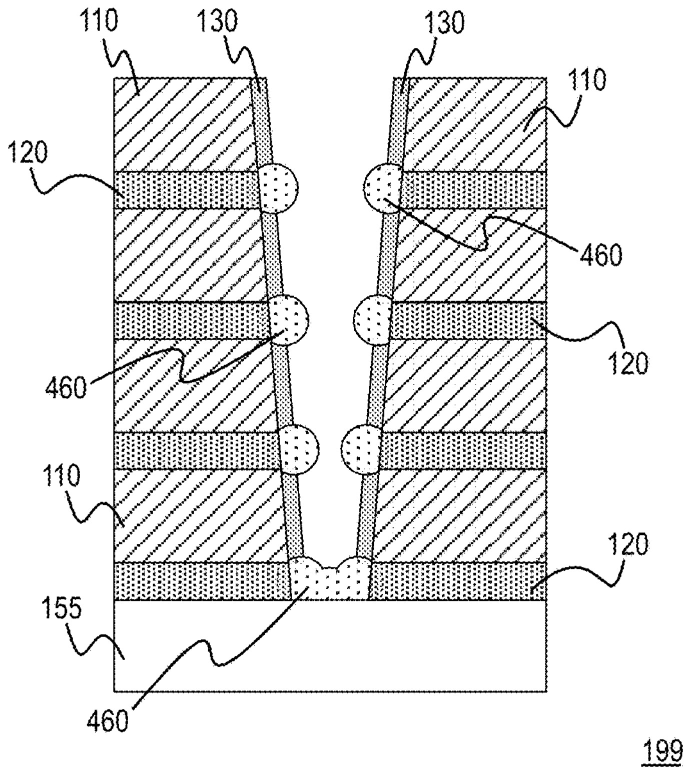
Figure 4B:
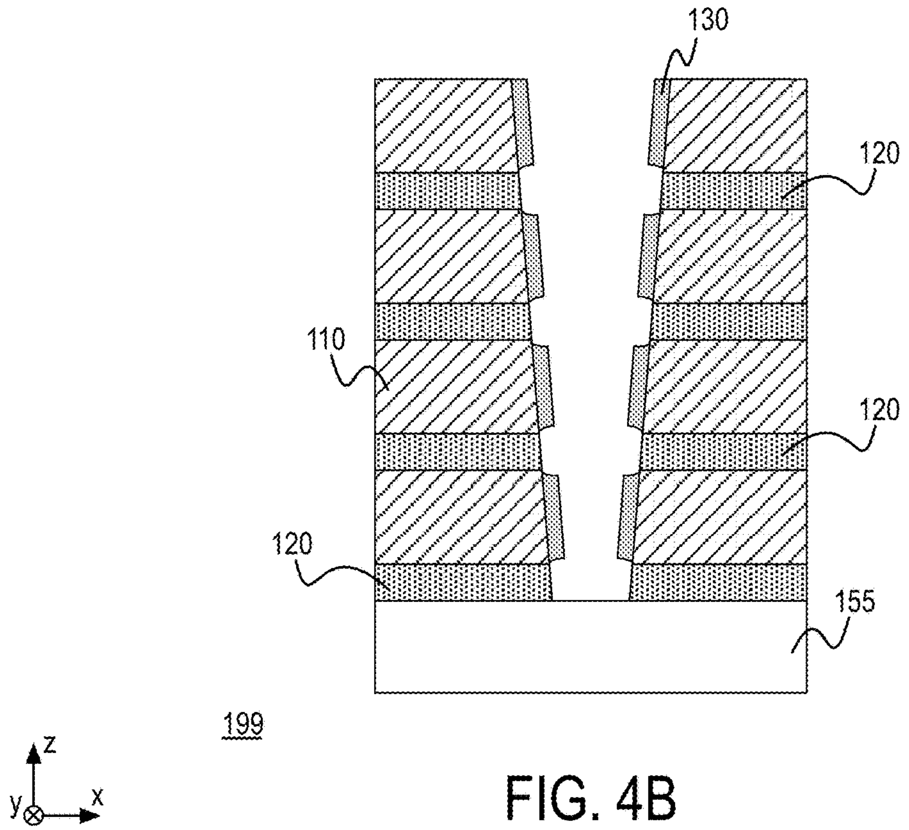

FIGS. 4A, 4B, and 4C illustrate cross-sectional profile views of memory device 100, including multiple ferroelectric capacitors 101 with outer plates 110 and ferroelectric layers 130 around shared inner plate 140, at various stages of manufacture, in accordance with some embodiments. FIG. 4A shows a mask material 460, e.g., as may be formed by methods 200 as described, on insulators 120 and between ferroelectric layers 130. Mask material 460 is also over source contact 155 below outer plates 110. Mask material 460 may mask insulators 120 and source contact 155, e.g., while forming ferroelectric layers 130. In the example of FIG. 4A, mask material 460 includes molecular assemblies of organic molecules organized into large-ordered domains.

FIG. 4B shows insulators 120 exposed without mask material 460 and with a scallop shape where mask material 460 was adjacent to insulators 120. No mask material 460 is over source contact 155, which is exposed, e.g., for coupling to a metallization structure, such as an inner plate.

FIG. 4C shows memory device 100 with an array of ferroelectric capacitors 101 having shared inner plate 140. Inner plate 140 is coupled to source contact 155 and electrically connected to the associated access transistor through its source contact 155. In some embodiments, more ferroelectric may be selectively formed over ferroelectric layers 130, e.g., by operation 230 of methods 200.

Figure 5A:
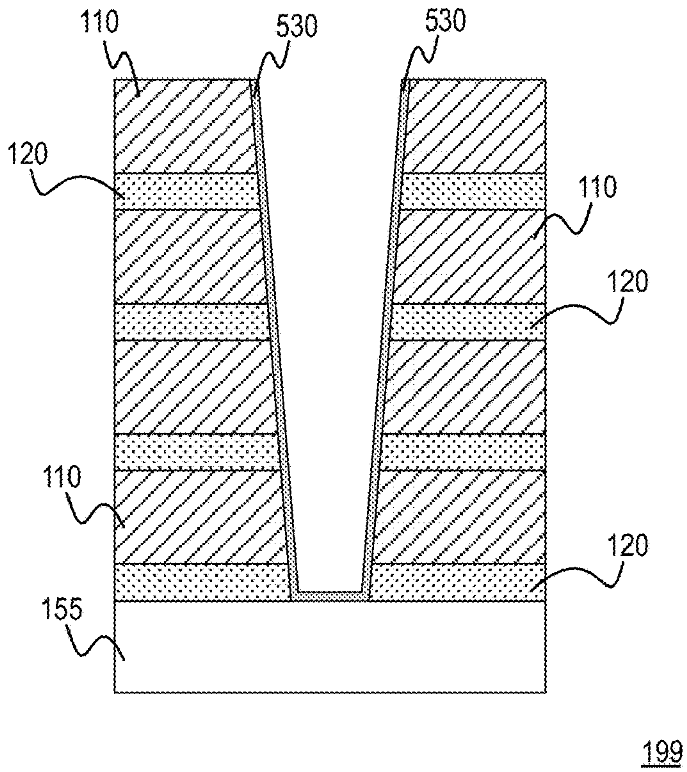
FIGS. 5A, 5B, and 5C illustrate cross-sectional profile views of a memory device, including multiple ferroelectric capacitors with outer plates and ferroelectric layers around a shared inner plate, at various stages of manufacture.
Figure 5B:
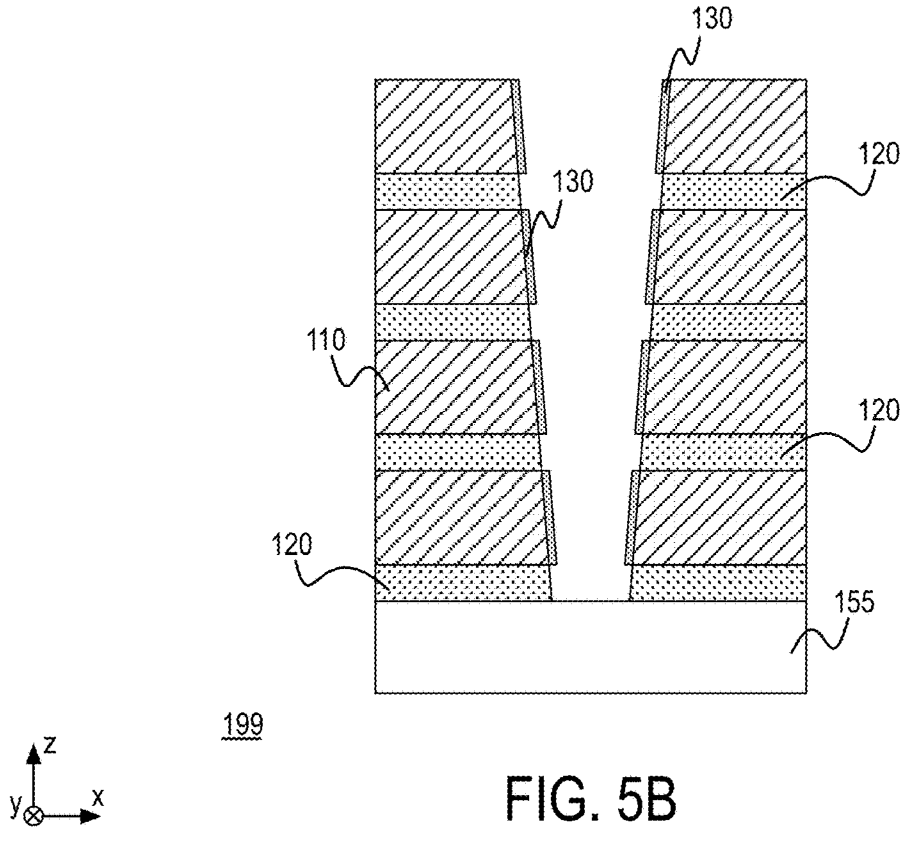
Figure 5C:
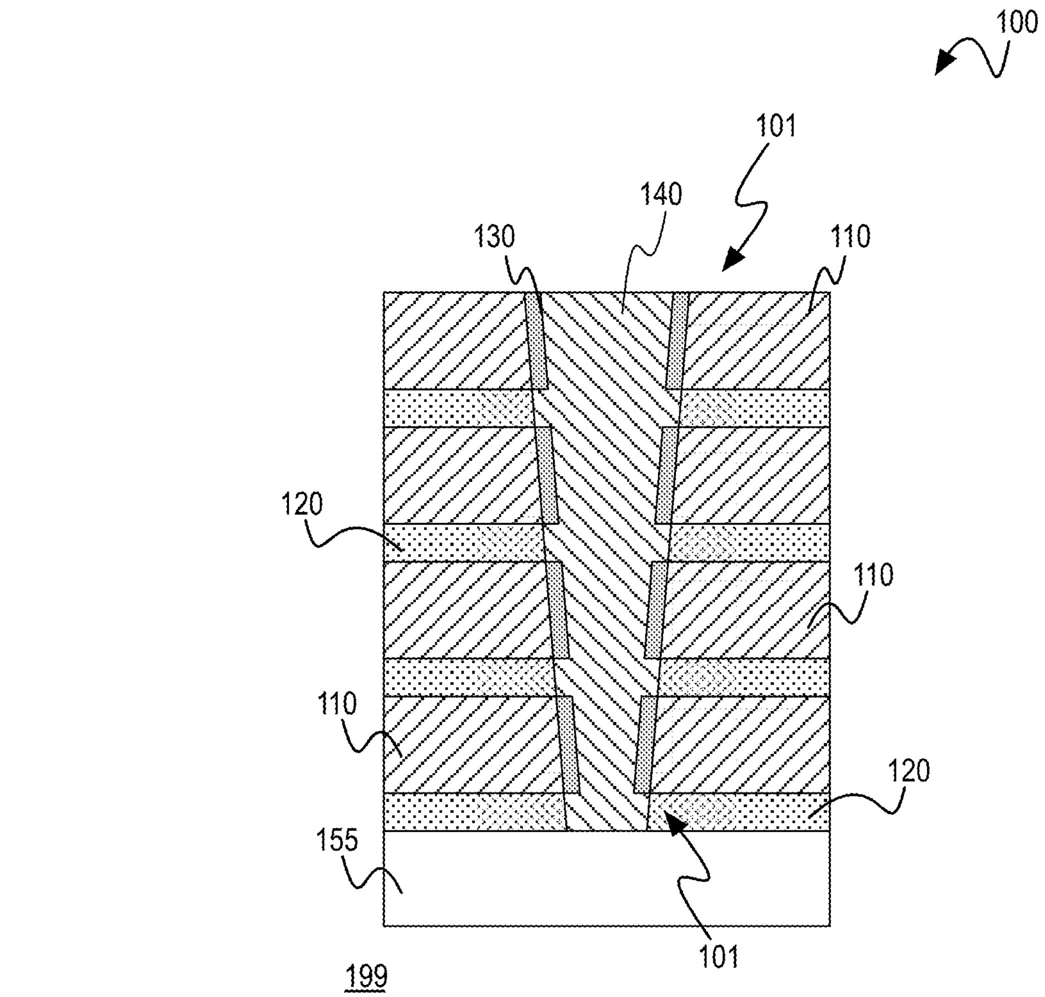

FIGS. 5A, 5B, and 5C illustrate cross-sectional profile views of memory device 100, including multiple ferroelectric capacitors 101 with outer plates 110 and ferroelectric layers 130 around shared inner plate 140, at various stages of manufacture, in accordance with some embodiments. FIG. 5A shows a ferroelectric layer 530 over outer plates 110, insulators 120, and source contact 155 in IC die 199. Although ferroelectric layer 530 is also over insulators 120, ferroelectric layer 530 may have been selectively formed over outer plates 110 by operation 230 of methods 200, e.g., by a cyclic deposition process. The ferroelectric material over insulators 120 is of a lesser quality than the ferroelectric material deposited on outer plates 110, and there is an etch selectivity between the ferroelectric material formed on the insulators and the ferroelectric material deposited on the conductive plates. Although source contact 155 is a metallization structure, the ferroelectric material over source contact 155 is of a lesser quality than the ferroelectric material deposited on outer plates 110, and there is an etch selectivity between the ferroelectric material formed on source contact 155 and the ferroelectric material deposited on outer plates 110.

FIG. 5B shows ferroelectric layers 130 on outer plates 110 but not on insulators 120. For example, ferroelectric material may have been selectively removed from over insulators 120 and source contact 155, e.g., by a cyclic etch as described in operation 230 of methods 200.

FIG. 5C shows IC die 199 and memory device 100 with an array of ferroelectric capacitors 101 having shared inner plate 140. Ferroelectric layers 130 are larger with more ferroelectric material. Inner plate 140 is coupled to source contact 155 and electrically connected to the associated select transistor through its source contact 155.

Figure 6A:
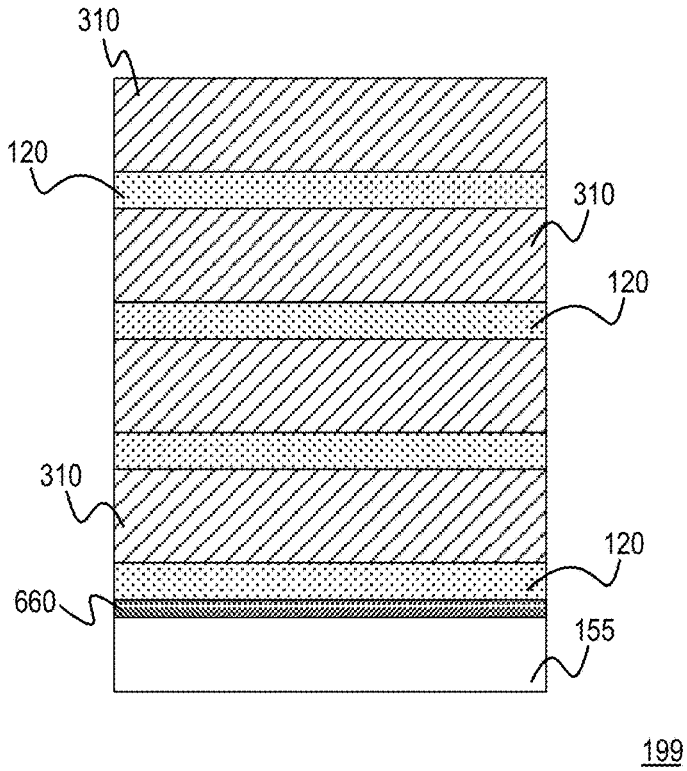
FIGS. 6A, 6B, 6C, and 6D illustrate cross-sectional profile views of a memory device, including multiple ferroelectric capacitors with outer plates and ferroelectric layers around a shared inner plate, at various stages of manufacture.

FIGS. 6A, 6B, 6C, and 6D illustrate cross-sectional profile views of memory device 100, including multiple ferroelectric capacitors 101 with outer plates 110 and ferroelectric layers 130 around shared inner plate 140, at various stages of manufacture, in accordance with some embodiments. FIG. 6A shows an interleaved stack of conductive plates 310 and insulators 120 over a non-growth layer 660 and source contact 155 of an access transistor (not shown) in IC die 199. Non-growth layer 660 may be of a non-growth material that the ferroelectric material will not deposit on or will have poor or delayed nucleation over. In some embodiments, non-growth layer 660 includes carbon, e.g., a hard-mask material. In some such embodiments, non-growth layer 660 includes silicon and carbon. In some embodiments, non-growth layer 660 includes amorphous carbon. In some such embodiments, non-growth layer 660 includes silicon and nitrogen.

Figure 6B:
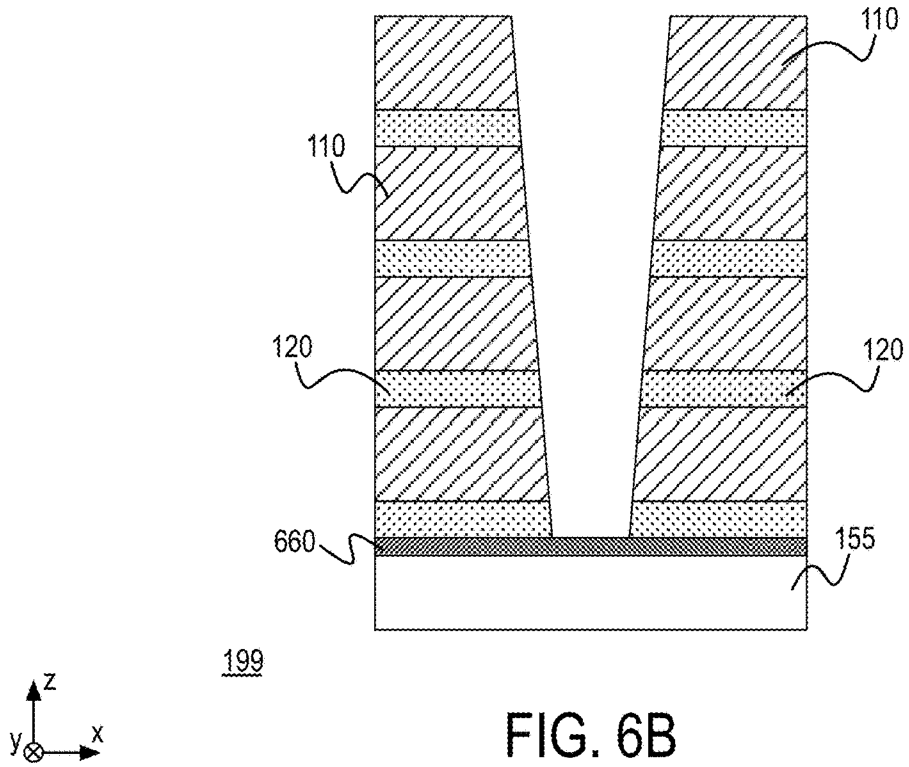

FIG. 6B shows outer plates 110 and insulators 120 around an opening over non-growth layer 660 and source contact 155.

Figure 6C:
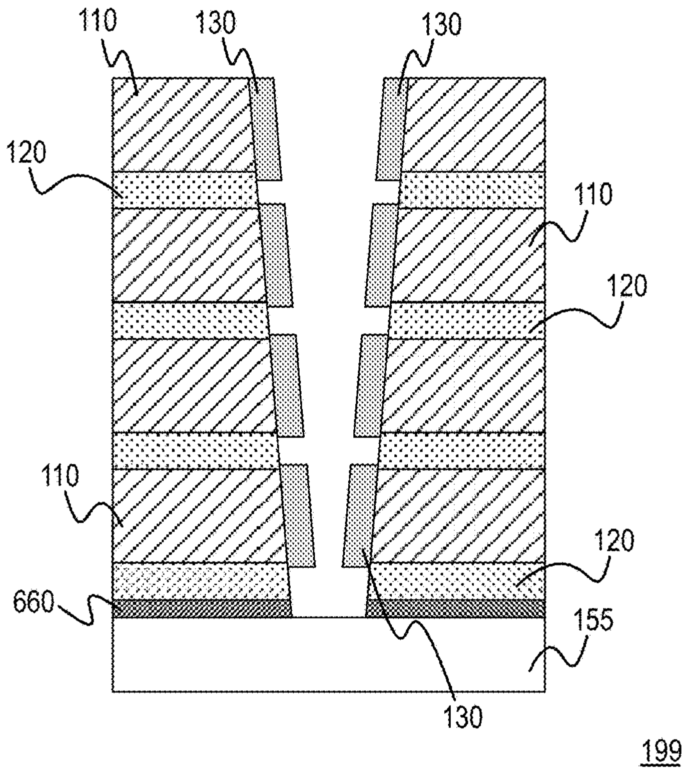

FIG. 6C shows IC die 199 with separate ferroelectric layers 130 on each of outer plates 110. Source contact 155 is exposed at a hole through non-growth layer 660. In some embodiments, non-growth layer 660 masks deposition of ferroelectric material on source contact 155, and a hole through non-growth layer 660 allows for coupling to source contact 155 (and an electrically connected select transistor (not shown)).

Figure 6D:
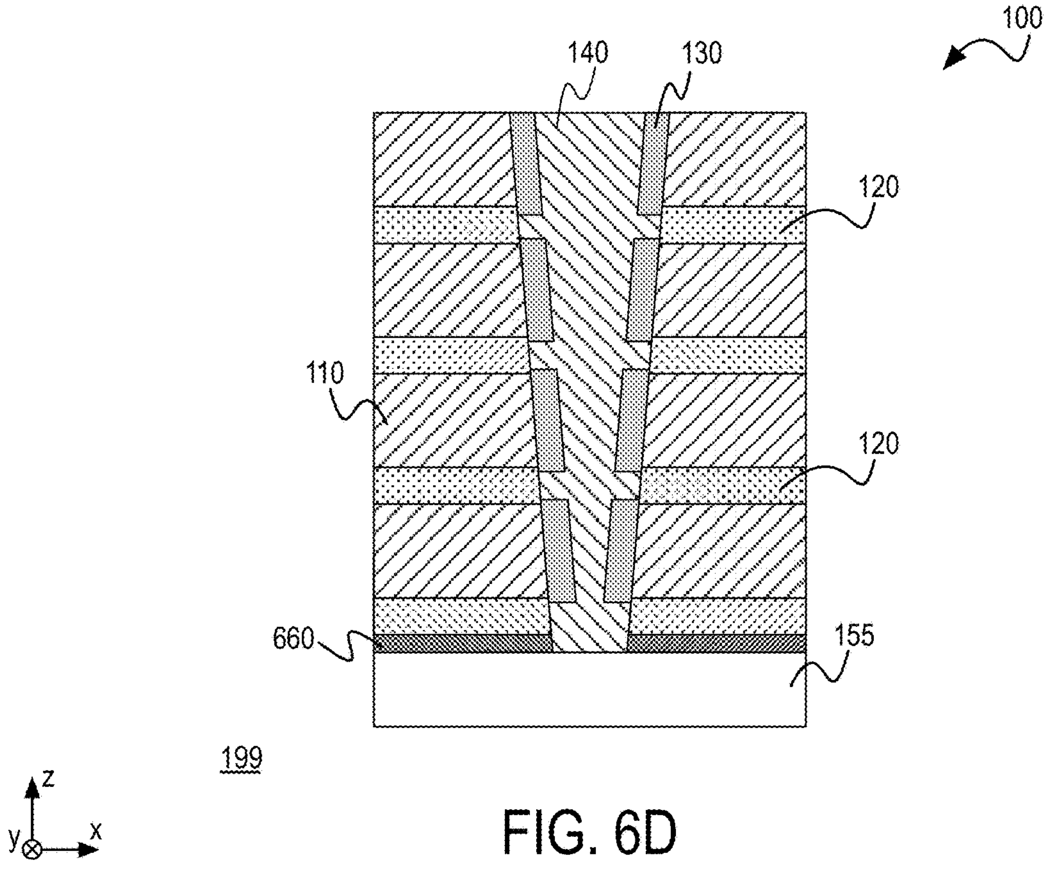

FIG. 6D shows IC die 199 and memory device 100 with an array of ferroelectric capacitors 101 having shared inner plate 140. Inner plate 140 is coupled to source contact 155 and electrically connected to the associated select transistor through its source contact 155. Non-growth layer 660 remains over source contact 155 and below a lowermost insulator 120.

Figure 7:
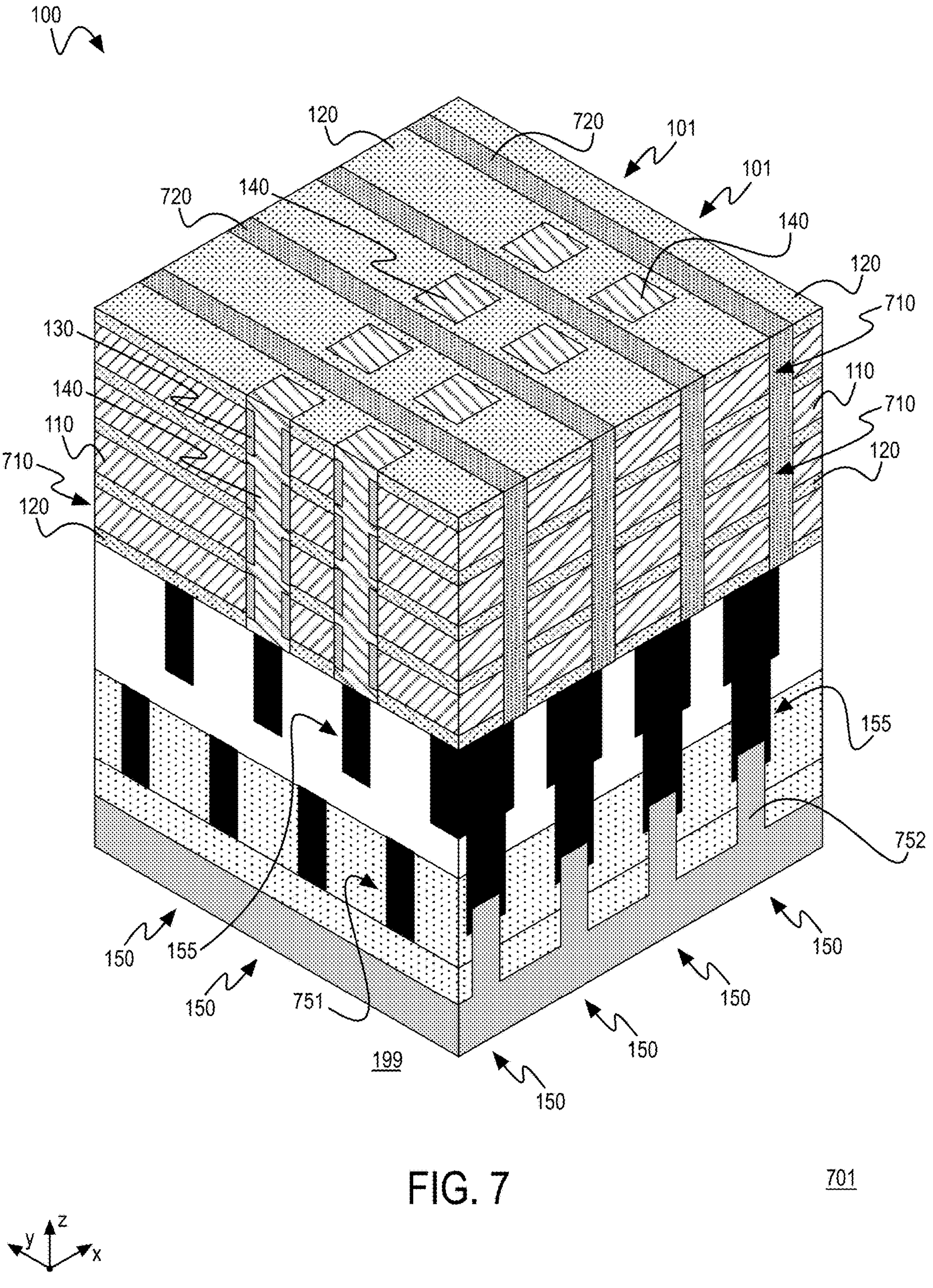
FIG. 7 illustrates an isometric view of a memory device in an IC die, including multiple select transistors coupled to corresponding groups of ferroelectric capacitors.

FIG. 7 illustrates an isometric view of memory device 100 in IC die 199, including multiple select transistors 150 coupled to corresponding groups of ferroelectric capacitors 101, in accordance with some embodiments. A group of ferroelectric capacitors 101 has a single inner plate 140. Each inner plate 140 is shared by (extends through) multiple, distinct (not contiguous) ferroelectric layers 130 and outer plates 110. Individual ferroelectric capacitors 101 each include a separate outer plate 110 around a separate ferroelectric layer 130. Ferroelectric layers 130 cover outer plates 110 and are between outer plates 110 and inner plate 140. Insulators 120 are between ferroelectric capacitors 101 and separate outer plates 110 in vertically adjacent ferroelectric capacitors 101. Inner plate 140 has a greater width between vertically adjacent ferroelectric capacitors 101 than within ferroelectric capacitors 101. This greater width of inner plate 140 is vertically between, and separates, ferroelectric layers 130 in vertically adjacent ferroelectric capacitors 101, where inner plate 140 has lesser widths.

The stacks of ferroelectric capacitors 101 are each coupled, and electrically connected, to a corresponding source contact 155 (and a respective select transistor 150) by the stack's shared inner plate 140. Select transistors 150 each have a channel 752. Channels 752 are within fins oriented in the y direction, and gate electrodes 751 are oriented in the x direction. Gate electrodes 751 may be coupled in the x direction with other gate electrodes 751, e.g., in a common wordline. In the example of FIG. 7, select transistors 150 are FinFETs in a lower layer on a frontside of IC die 199. Other configurations may be used. For example, select transistors 150 may be planar transistors. In some embodiments, select transistors 150 have channels 752 within nanowires or nanosheets.

Outer plates 110 are each part of an integrated structure with a corresponding plateline 710. Ferroelectric layers 130 are on inner surfaces of corresponding platelines 710, which are integral with corresponding outer plates 110. Within a group of ferroelectric capacitors 101 with a common inner plate 140, vertically adjacent platelines 710 are separated by insulators 120. Vertical insulators 720 are between laterally adjacent platelines 710 and between laterally adjacent ferroelectric capacitors 101 (not sharing an inner plate 140).

IC die 199 is coupled, and electrically connected, to a system substrate 701. IC die 199 is coupled, and electrically connected, to a power supply through system substrate 701. System substrate 701 may be any host component, such as a package substrate or interposer, another IC die, etc. System substrate 701 may couple to another host component, such as a package substrate or interposer, another IC die, etc. In some embodiments, IC die 199 is coupled, and electrically connected, to system substrate 701 through an intervening host component. System substrate 701 may include a power supply or be coupled to a power supply through another host component.

Figure 8:
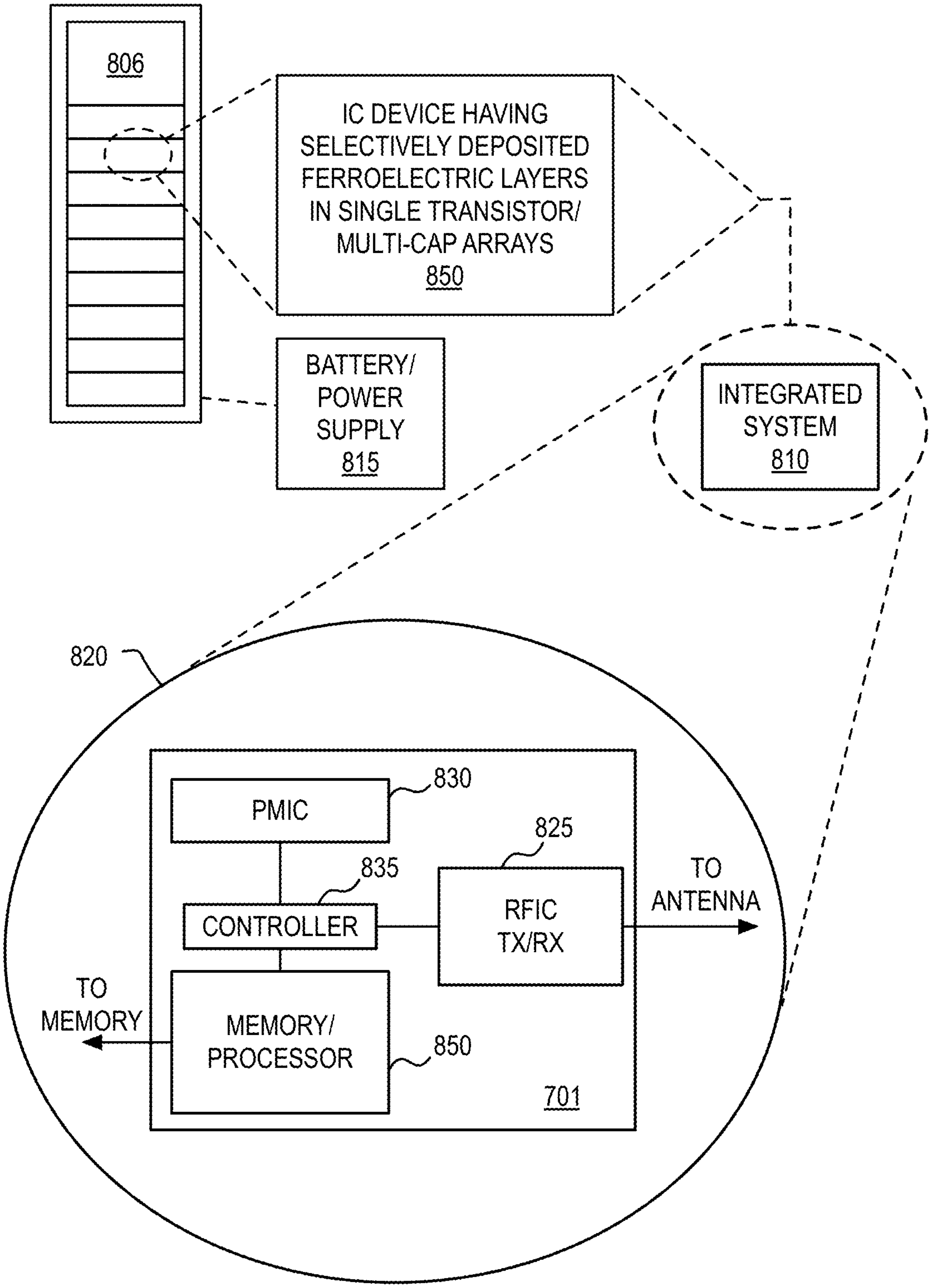
FIG. 8 illustrates a diagram of an example data server machine employing an IC device having ferroelectric capacitor arrays with selectively deposited ferroelectric material.

FIG. 8 illustrates a diagram of an example data server machine 806 employing an IC device having ferroelectric capacitor arrays with selectively deposited ferroelectric material, in accordance with some embodiments. Server machine 806 may be any commercial server, for example, including any number of high-performance computing platforms disposed within a rack and networked together for electronic data processing, which in the exemplary embodiment includes one or more devices 850 having ferroelectric capacitor arrays with selectively deposited ferroelectric material.

Server machine 806 includes a battery and/or power supply 815 to provide power to devices 850, and to provide, in some embodiments, power delivery functions such as power regulation. Devices 850 may be deployed as part of a package-level integrated system 810. Integrated system 810 is further illustrated in the expanded view 820. In the exemplary embodiment, devices 850 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 850 is a microprocessor including an SRAM cache memory. As shown, device 850 may include an IC device having ferroelectric capacitor arrays with selectively deposited ferroelectric material, as discussed herein. Device 850 may be further coupled to (e.g., communicatively coupled to) a board, an interposer, or system substrate 701 along with, one or more of a power management IC (PMIC) 830, RF (wireless) IC (RFIC) 825, including a wideband RF (wireless) transmitter and/or receiver (TX/RX) (e.g., including a digital baseband and an analog front end module further comprises a power amplifier on a transmit path and a low noise amplifier on a receive path), and a controller 835 thereof. In some embodiments, RFIC 825, PMIC 830, controller 835, and device 850 include IC devices having ferroelectric capacitor arrays with selectively deposited ferroelectric material.

FIG. 9 is a block diagram of an example computing device 900, in accordance with some embodiments. For example, one or more components of computing device 900 may include any of the devices or structures discussed herein. A number of components are illustrated in FIG. 9 as being included in computing device 900, but any one or more of these components may be omitted or duplicated, as suitable for the application. In some embodiments, some or all of the components included in computing device 900 may be attached to one or more printed circuit boards (e.g., a motherboard). In some embodiments, various ones of these components may be fabricated onto a single system-on-a-chip (SoC) die. Additionally, in various embodiments, computing device 900 may not include one or more of the components illustrated in FIG. 9, but computing device 900 may include interface circuitry for coupling to the one or more components. For example, computing device 900 may not include a display device 903, but may include display device interface circuitry (e.g., a connector and driver circuitry) to which display device 903 may be coupled. In another set of examples, computing device 900 may not include an audio output device 904, other output device 905, global positioning system (GPS) device 909, audio input device 910, or other input device 911, but may include audio output device interface circuitry, other output device interface circuitry, GPS device interface circuitry, audio input device interface circuitry, audio input device interface circuitry, to which audio output device 904, other output device 905, GPS device 909, audio input device 910, or other input device 911 may be coupled.

Computing device 900 may include a processing device 901 (e.g., one or more processing devices). As used herein, the term "processing device" or "processor" indicates a device that processes electronic data from registers and/or memory to transform that electronic data into other electronic data that may be stored in registers and/or memory (e.g., SRAM). Processing device 901 may include a memory 921, a communication device 922, a refrigeration device 923, a battery/power regulation device 924, logic 925, interconnects 926 (i.e., optionally including redistribution layers (RDL) or metal-insulator-metal (MIM) devices), a heat regulation device 927, and a hardware security device 928.

Processing device 901 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

Computing device 900 may include a memory 902, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 902 includes memory that shares a die with processing device 901. This memory may be used as cache memory and may include embedded dynamic random-access memory (eDRAM) or spin transfer torque magnetic random-access memory (STT-M RAM).

Computing device 900 may include a heat regulation/refrigeration device 906. Heat regulation/refrigeration device 906 may maintain processing device 901 (and/or other components of computing device 900) at a predetermined low temperature during operation.

In some embodiments, computing device 900 may include a communication chip 907 (e.g., one or more communication chips). For example, the communication chip 907 may be configured for managing wireless communications for the transfer of data to and from computing device 900. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 907 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 907 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 907 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 907 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 907 may operate in accordance with other wireless protocols in other embodiments. Computing device 900 may include an antenna 913 to facilitate wireless communications and/or to receive other wireless communications (such as AM or FM radio transmissions).

In some embodiments, communication chip 907 may manage wired communications, such as electrical, optical, or any other suitable communication protocols (e.g., the Ethernet). As noted above, communication chip 907 may include multiple communication chips. For instance, a first communication chip 907 may be dedicated to shorter-range wireless communications such as Wi-Fi or Bluetooth, and a second communication chip 907 may be dedicated to longer-range wireless communications such as GPS, EDGE, GPRS, CDMA, WiMAX, LTE, EV-DO, or others. In some embodiments, a first communication chip 907 may be dedicated to wireless communications, and a second communication chip 907 may be dedicated to wired communications.

Computing device 900 may include battery/power circuitry 908. Battery/power circuitry 908 may include one or more energy storage devices (e.g., batteries or capacitors) and/or circuitry for coupling components of computing device 900 to an energy source separate from computing device 900 (e.g., AC line power).

Computing device 900 may include a display device 903 (or corresponding interface circuitry, as discussed above). Display device 903 may include any visual indicators, such as a heads-up display, a computer monitor, a projector, a touchscreen display, a liquid crystal display (LCD), a light-emitting diode display, or a flat panel display, for example.

Computing device 900 may include an audio output device 904 (or corresponding interface circuitry, as discussed above). Audio output device 904 may include any device that generates an audible indicator, such as speakers, headsets, or earbuds, for example.

Computing device 900 may include an audio input device 910 (or corresponding interface circuitry, as discussed above). Audio input device 910 may include any device that generates a signal representative of a sound, such as microphones, microphone arrays, or digital instruments (e.g., instruments having a musical instrument digital interface (MIDI) output).

Computing device 900 may include a GPS device 909 (or corresponding interface circuitry, as discussed above). GPS device 909 may be in communication with a satellite-based system and may receive a location of computing device 900, as known in the art.

Computing device 900 may include other output device 905 (or corresponding interface circuitry, as discussed above). Examples of the other output device 905 may include an audio codec, a video codec, a printer, a wired or wireless transmitter for providing information to other devices, or an additional storage device.

Computing device 900 may include other input device 911 (or corresponding interface circuitry, as discussed above). Examples of the other input device 911 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 900 may include a security interface device 912. Security interface device 912 may include any device that provides security measures for computing device 900 such as intrusion detection, biometric validation, security encode or decode, access list management, malware detection, or spyware detection.

Computing device 900, or a subset of its components, may have any appropriate form factor, such as a hand-held or mobile computing device (e.g., a cell phone, a smart phone, a mobile internet device, a music player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The subject matter of the present description is not necessarily limited to specific applications illustrated in FIGS. 1-9. The subject matter may be applied to other deposition applications, as well as any appropriate manufacturing application, as will be understood to those skilled in the art.

The following examples pertain to further embodiments, and specifics in the examples may be used anywhere in one or more embodiments.

In one or more first embodiments, a memory device includes a plurality of vertically aligned ferroelectric capacitors, wherein individual ones of the ferroelectric capacitors include an outer plate, a ferroelectric layer internal to the outer plate, wherein individual ones of the ferroelectric layers are not contiguous to each other, and an individual portion of a shared inner plate extending through individual ones of the ferroelectric layers and the outer plates, wherein the inner plate has a first width within a first one of the ferroelectric capacitors, a second width within a second one of the ferroelectric capacitors, and a third width between the first and second ones of the ferroelectric capacitors, the third width being greater than the first and second widths, and an access transistor coupled to the inner plate.

In one or more second embodiments, further to the first embodiments, a portion of the inner plate at the third width is vertically between the ferroelectric layers.

In one or more third embodiments, further to the first or second embodiments, individual ones of the ferroelectric layers include a non-perovskite metal oxide in an orthorhombic or tetragonal phase.

In one or more fourth embodiments, further to the first through third embodiments, individual ones of the ferroelectric layers include hafnium and oxygen.

In one or more fifth embodiments, further to the first through fourth embodiments, individual ones of the ferroelectric layers include predominantly hafnium, zirconium, and oxygen.

In one or more sixth embodiments, further to the first through fifth embodiments, an outer plate includes predominantly tungsten, molybdenum, or both titanium and nitrogen.

In one or more seventh embodiments, further to the first through sixth embodiments, an insulator is between vertically adjacent outer plates, and wherein the insulator includes oxygen and carbon, or predominantly silicon and oxygen.

In one or more eighth embodiments, a memory device includes an IC die coupled to a power supply, the IC die including a select transistor, and a plurality of vertically aligned ferroelectric capacitors coupled to the select transistor, wherein individual ones of the ferroelectric capacitors include a first plate laterally around a ferroelectric layer, wherein the ferroelectric layer includes ferroelectric material not contiguous to ferroelectric material of a next individual one of the ferroelectric capacitors, an individual portion of a second plate extending through individual ones of the first plates and the ferroelectric layers, wherein the second plate has a first width between individual ones of the ferroelectric capacitors greater than a second width within an individual one of the ferroelectric capacitors.

In one or more ninth embodiments, further to the eighth embodiments, individual ones of the ferroelectric layers include a non-perovskite metal oxide in an orthorhombic or tetragonal phase.

In one or more tenth embodiments, further to the eighth or ninth embodiments, individual ones of the ferroelectric layers include hafnium and oxygen.

In one or more eleventh embodiments, a method includes receiving an interleaved stack of insulators and first plates, forming an opening with a shared sidewall through the insulators and the first plates, forming ferroelectric material on the first plates but substantially absent from the insulators, and forming a plurality of ferroelectric capacitors by forming a second plate in the opening, wherein the second plate is on the insulators and the ferroelectric material, and is shared by the first plates.

In one or more twelfth embodiments, further to the eleventh embodiments, forming ferroelectric material on the first plates but substantially absent from the insulators includes selectively removing ferroelectric material over the insulators.

In one or more thirteenth embodiments, further to the eleventh or twelfth embodiments, forming ferroelectric material on the first plates but substantially absent from the insulators includes depositing ferroelectric material over the first plates at a higher deposition rate than over the insulators.

In one or more fourteenth embodiments, further to the eleventh through thirteenth embodiments, forming ferroelectric material includes depositing ferroelectric material over the first plates and the insulators using a cyclic deposition, such that there is an etch selectivity between the ferroelectric material over the insulators and the ferroelectric material over the first plates.

In one or more fifteenth embodiments, further to the eleventh through fourteenth embodiments, the method further includes selectively removing the ferroelectric material over the insulators by a cyclic etch.

In one or more sixteenth embodiments, further to the eleventh through fifteenth embodiments, the cyclic etch uses a precursor gas including both hydrogen and fluorine or both boron and chlorine.

In one or more seventeenth embodiments, further to the eleventh through sixteenth embodiments, the method further includes depositing a non-growth material in the opening below the first plates.

In one or more eighteenth embodiments, further to the eleventh through seventeenth embodiments, the method further includes depositing monolayers of organic material over the insulators.

In one or more nineteenth embodiments, further to the eleventh through eighteenth embodiments, the organic material includes silicon, hydrogen, and at least one of carbon or chlorine.

In one or more twentieth embodiments, further to the eleventh through nineteenth embodiments, forming ferroelectric material uses a precursor gas including hafnium, carbon, hydrogen, and nitrogen.

The disclosure can be practiced with modification and alteration, and the scope of the appended claims is not limited to the embodiments so described. For example, the above embodiments may include specific combinations of features. However, the above embodiments are not limiting in this regard and, in various implementations, the above embodiments may include the undertaking only a subset of such features, undertaking a different order of such features, undertaking a different combination of such features, and/or undertaking additional features than those features explicitly listed. The scope of the patent rights should, therefore, be determined with reference to the appended claims, along with the full scope of equivalents to which such claims are entitled.

We claim:

1. A memory device, comprising:

a plurality of vertically aligned ferroelectric capacitors, wherein individual ones of the ferroelectric capacitors comprise:

an outer plate;

a ferroelectric layer internal to the outer plate, wherein individual ones of the ferroelectric layers are not contiguous to each other; and an individual portion of a shared inner plate extending through individual ones of the ferroelectric layers and the outer plates, wherein the inner plate has a first width within a first one of the ferroelectric capacitors, a second width within a second one of the ferroelectric capacitors, and a third width between the first and second ones of the ferroelectric capacitors, the third width being greater than the first and second widths; and an access transistor coupled to the inner plate.

2. The memory device of claim 1, wherein a portion of the inner plate at the third width is vertically between the ferroelectric layers of the first one of the ferroelectric capacitors and the second one of the ferroelectric capacitors.

3. The memory device of claim 2, further comprising an insulator between vertically adjacent outer plates, wherein the insulator comprises oxygen and carbon, or predominantly silicon and oxygen, and wherein the portion of the inner plate at the third width is on the insulator between the first one of the ferroelectric capacitors and the second one of the ferroelectric capacitors.

4. The memory device of claim 3, wherein the insulator further comprises an organic material, and the portion of the inner plate at the third width is on the organic material.

5. The memory device of claim 1, wherein individual ones of the ferroelectric layers comprise a scallop shape.

6. The memory device of claim 1, wherein individual ones of the ferroelectric layers comprise a non-perovskite metal oxide in an orthorhombic or tetragonal phase.

7. The memory device of claim 6, wherein individual ones of the ferroelectric layers comprise hafnium and oxygen.

8. The memory device of claim 7, wherein individual ones of the ferroelectric layers comprise predominantly hafnium, zirconium, and oxygen.

9. The memory device of claim 1, wherein the individual ones of the outer plates comprises predominantly tungsten, molybdenum, or both titanium and nitrogen.

10. The memory device of claim 1, further comprising:

an integrated circuit (IC) die coupled to a power supply, the IC die comprising the plurality of vertically aligned ferroelectric capacitors and the access transistor.

11. A memory device, comprising:

a plurality of vertically aligned ferroelectric capacitors, each of the ferroelectric capacitors comprising:

a ferroelectric layer within an outer plate, wherein each of the ferroelectric layers are not contiguous to each other; and a portion of a shared inner plate extending through the ferroelectric layers and the outer plates, wherein the inner plate has a first width extending between a first of the ferroelectric layers within a first of the ferroelectric capacitors, a second width extending between a second of the ferroelectric layers within a second of the ferroelectric capacitors, and a third width extending between an insulator layer between the first of the ferroelectric capacitors and the second of the ferroelectric capacitors, the third width being greater than the first and second widths; and a transistor coupled to the inner plate.

12. The memory device of claim 11, wherein a portion of the inner plate at the third width is vertically between the ferroelectric layers of the first of the ferroelectric capacitors and the second of the ferroelectric capacitors.

13. The memory device of claim 12, further comprising an insulator between vertically adjacent outer plates, wherein the insulator comprises oxygen and carbon, or predominantly silicon and oxygen, and wherein the portion of the inner plate at the third width is on the insulator between the first of the ferroelectric capacitors and the second of the ferroelectric capacitors.

14. The memory device of claim 13, wherein the insulator further comprises an organic material, and the portion of the inner plate at the third width is on the organic material.

15. The memory device of claim 11, wherein the ferroelectric layers comprise a scallop shape.

16. The memory device of claim 11, wherein the ferroelectric layers comprise a non-perovskite metal oxide in an orthorhombic or tetragonal phase.

17. The memory device of claim 16, wherein the ferroelectric layers comprise hafnium and oxygen.

18. The memory device of claim 11, wherein the ferroelectric layers comprise predominantly hafnium, zirconium, and oxygen.

19. The memory device of claim 11, wherein the outer plates comprises predominantly tungsten, molybdenum, or both titanium and nitrogen.

20. The memory device of claim 11, further comprising:

an integrated circuit (IC) die coupled to a power supply, the IC die comprising the plurality of vertically aligned ferroelectric capacitors and the transistor.

* * * * *